US007474529B2

(12) United States Patent
Tian et al.

(10) Patent No.: US 7,474,529 B2
(45) Date of Patent: Jan. 6, 2009

(54) FOLDED-SHEET-METAL HEATSINKS FOR CLOSELY PACKAGED HEAT-PRODUCING DEVICES

(75) Inventors: Shurong Tian, Yorktown Heights, NY (US); Shawn A. Hall, Pleasantville, NY (US); Paul W. Coteus, Yorktown, NY (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 11/564,353

(22) Filed: Nov. 29, 2006

(65) Prior Publication Data

US 2008/0123300 A1     May 29, 2008

(51) Int. Cl.
*H05K 7/20* (2006.01)
(52) U.S. Cl. ................ 361/704; 361/715; 361/716; 361/719; 361/721; 275/712; 165/80.3; 165/185
(58) Field of Classification Search ................ None
See application file for complete search history.

(56) References Cited

U.S. PATENT DOCUMENTS

| | | | | |
|---|---|---|---|---|
| 3,893,161 A | * | 7/1975 | Pesak, Jr. .................. 257/718 |
| 4,872,505 A | * | 10/1989 | Jones et al. ................ 165/80.3 |
| 5,109,318 A | * | 4/1992 | Funari et al. ................ 361/710 |
| 5,513,135 A | | 4/1996 | Dell et al. |
| 5,784,263 A | * | 7/1998 | Nelson ........................ 361/785 |
| 5,901,781 A | * | 5/1999 | Arai et al. .................. 165/80.3 |
| 6,173,382 B1 | | 1/2001 | Dell et al. |
| 6,208,517 B1 | * | 3/2001 | Prince et al. ................ 361/704 |
| 6,278,610 B1 | * | 8/2001 | Yasufuku et al. ............ 361/704 |
| 6,424,532 B2 | * | 7/2002 | Kawamura .................. 361/708 |
| 6,507,912 B1 | | 1/2003 | Matyas, Jr. et al. |
| 6,510,100 B2 | | 1/2003 | Grundon et al. |
| 6,535,387 B2 | * | 3/2003 | Summers et al. ............ 361/704 |
| 7,079,396 B2 | * | 7/2006 | Gates et al. ................. 361/719 |
| 7,106,595 B2 | * | 9/2006 | Foster et al. ................ 361/721 |
| 7,312,996 B2 | * | 12/2007 | Chang ........................ 361/704 |
| 7,403,383 B2 | * | 7/2008 | McGuff et al. .............. 361/688 |
| 2007/0139897 A1 | * | 6/2007 | RaghuRam .................. 361/720 |

* cited by examiner

*Primary Examiner*—Boris L Chervinsky
(74) *Attorney, Agent, or Firm*—Cantor Colburn LLP; Daniel Morris

(57) ABSTRACT

A folded heatsink for cooling heat-producing devices. The folded heatsink includes a substantially planar base having a first end and a second end. The base is intended to be affixed in thermal contact to an exposed, substantially planar surface of one or more heat-producing devices. The folded heatsink also includes two shoulders each having a proximal end and a distal end. The proximal ends of the shoulders project substantially at right angles from the first and second ends of the base. The folded heatsink also includes two arms each having a proximal end and a distal end. The proximal ends of the arms project substantially at right angles from the distal ends of the shoulders such that the base, shoulders and arms from a nearly closed rectangular tube formed from a continuous sheet of metal.

4 Claims, 33 Drawing Sheets

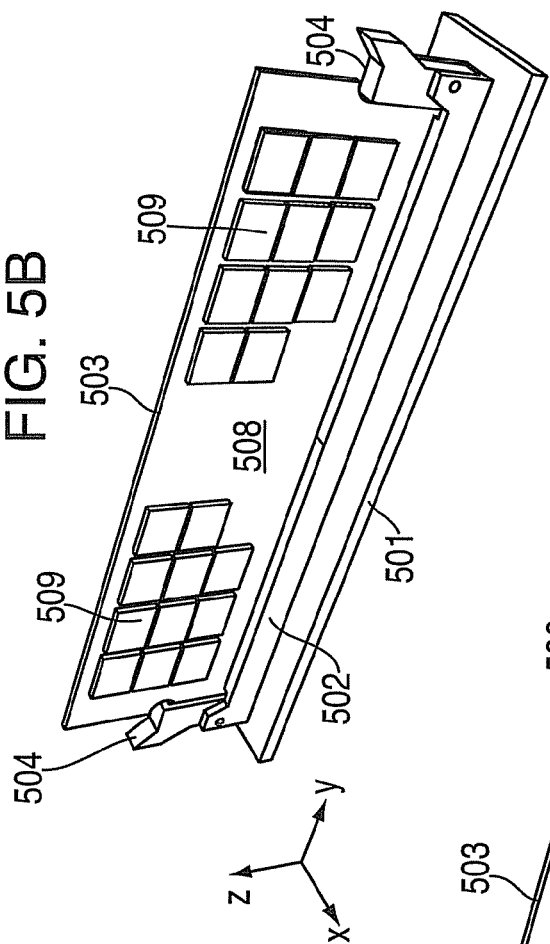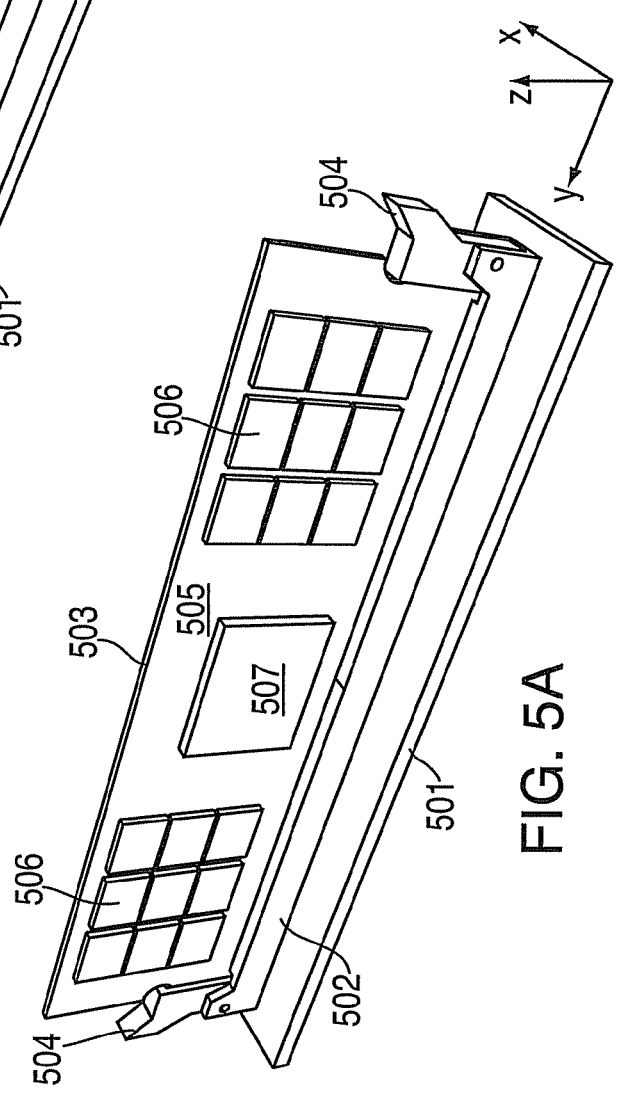

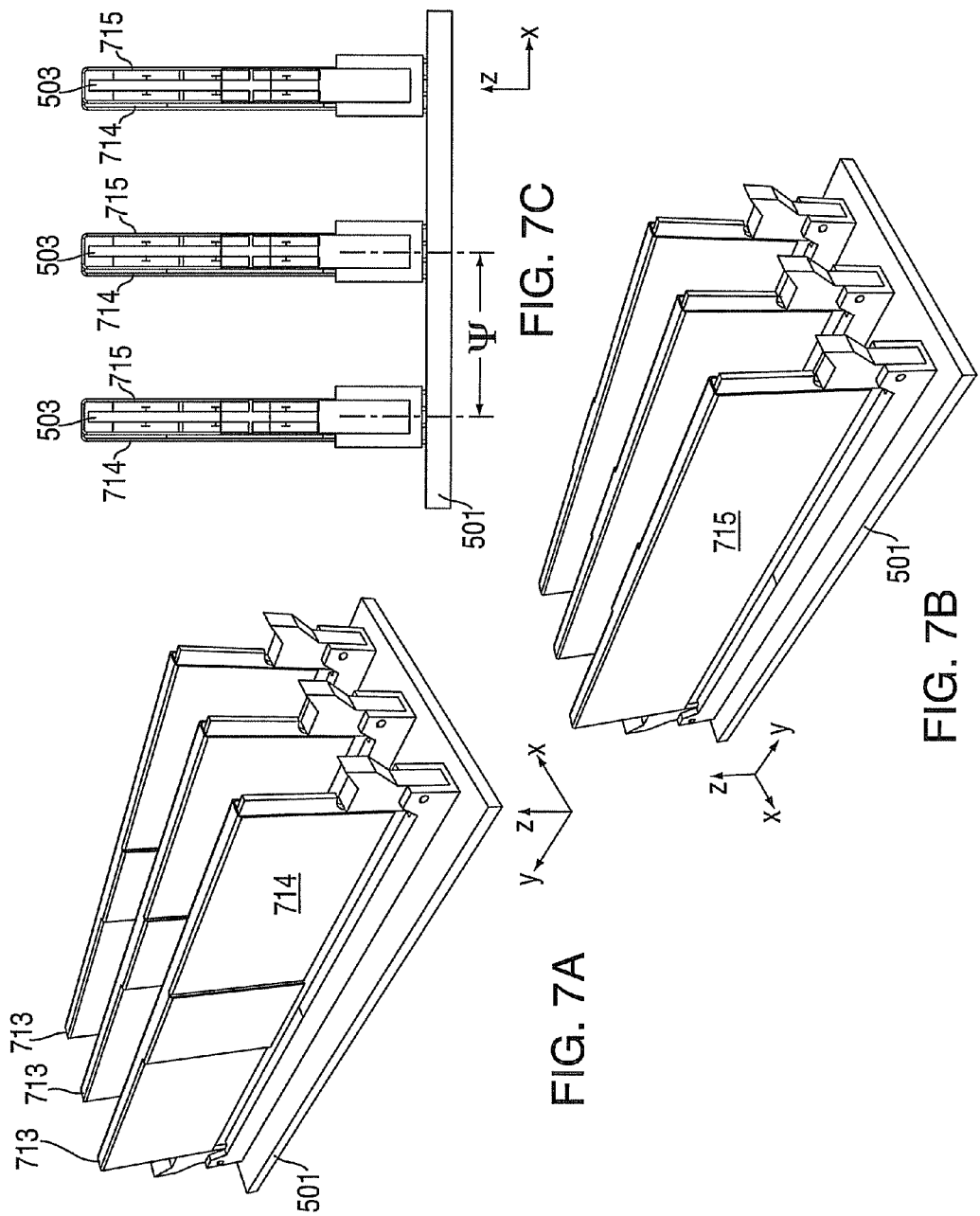

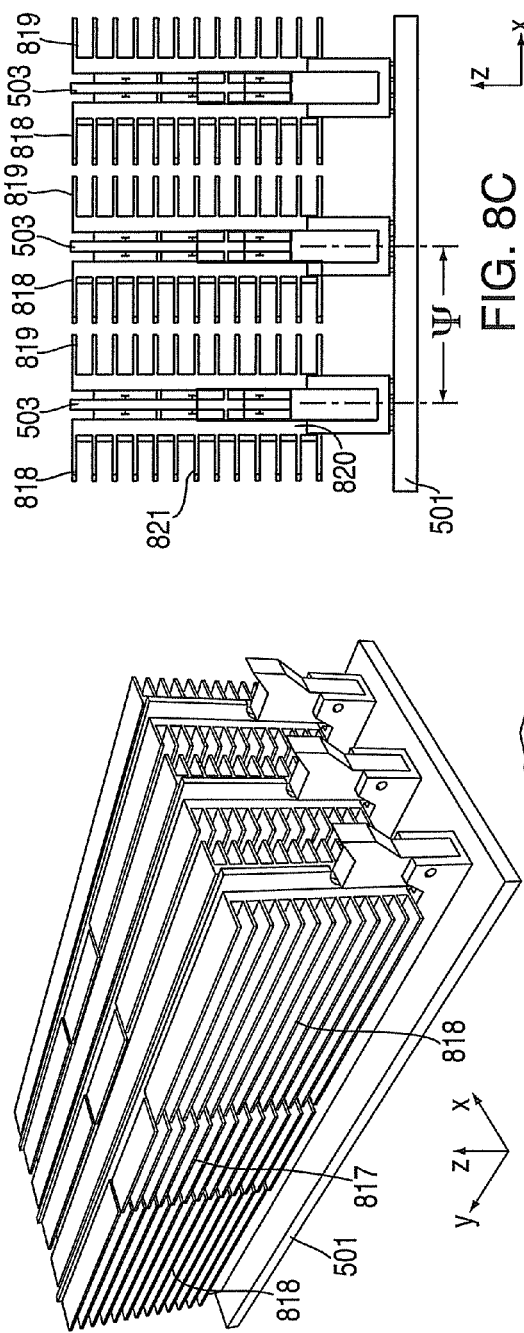
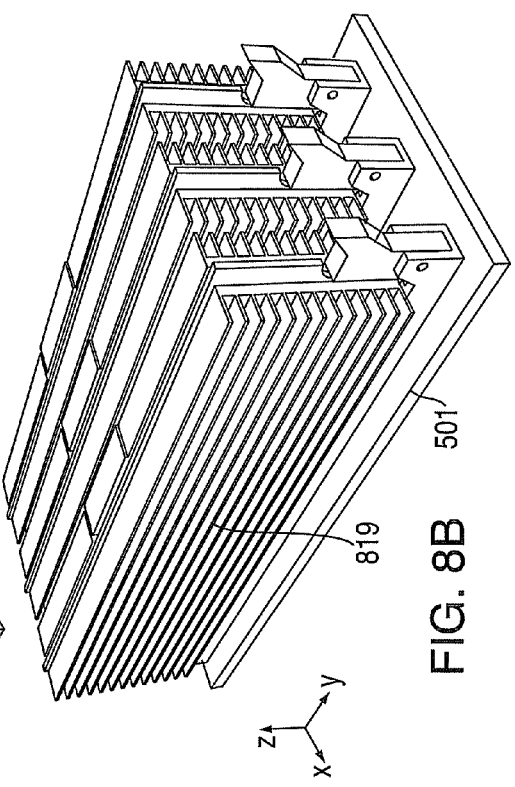
FIG. 8A
FIG. 8B
FIG. 8C

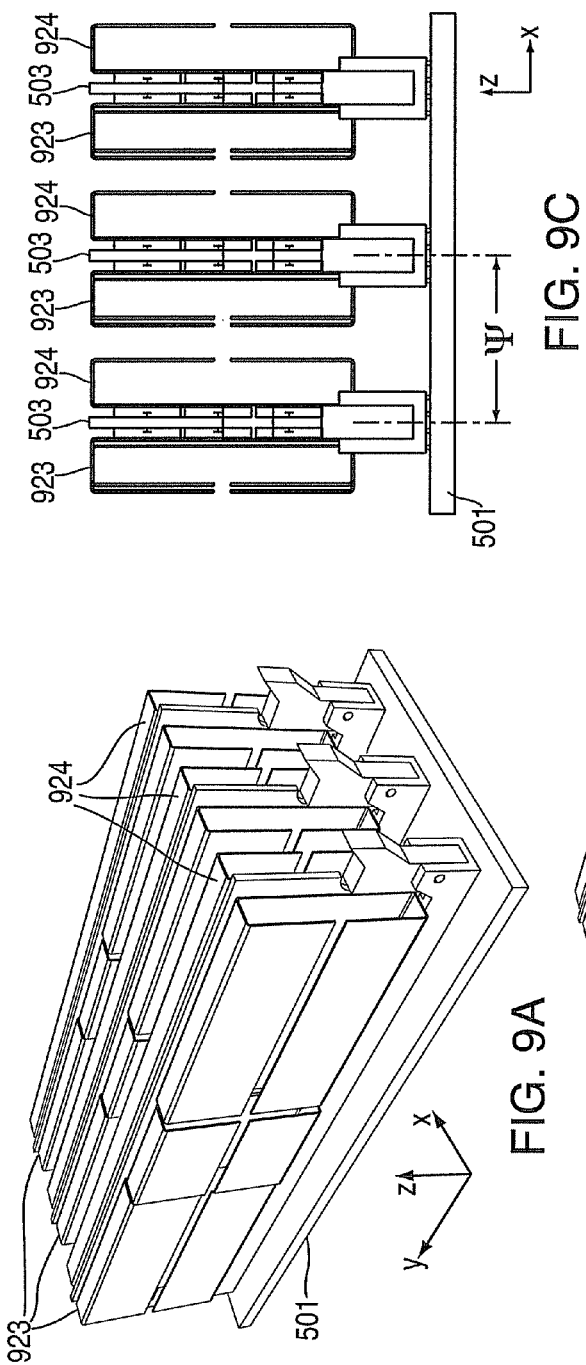

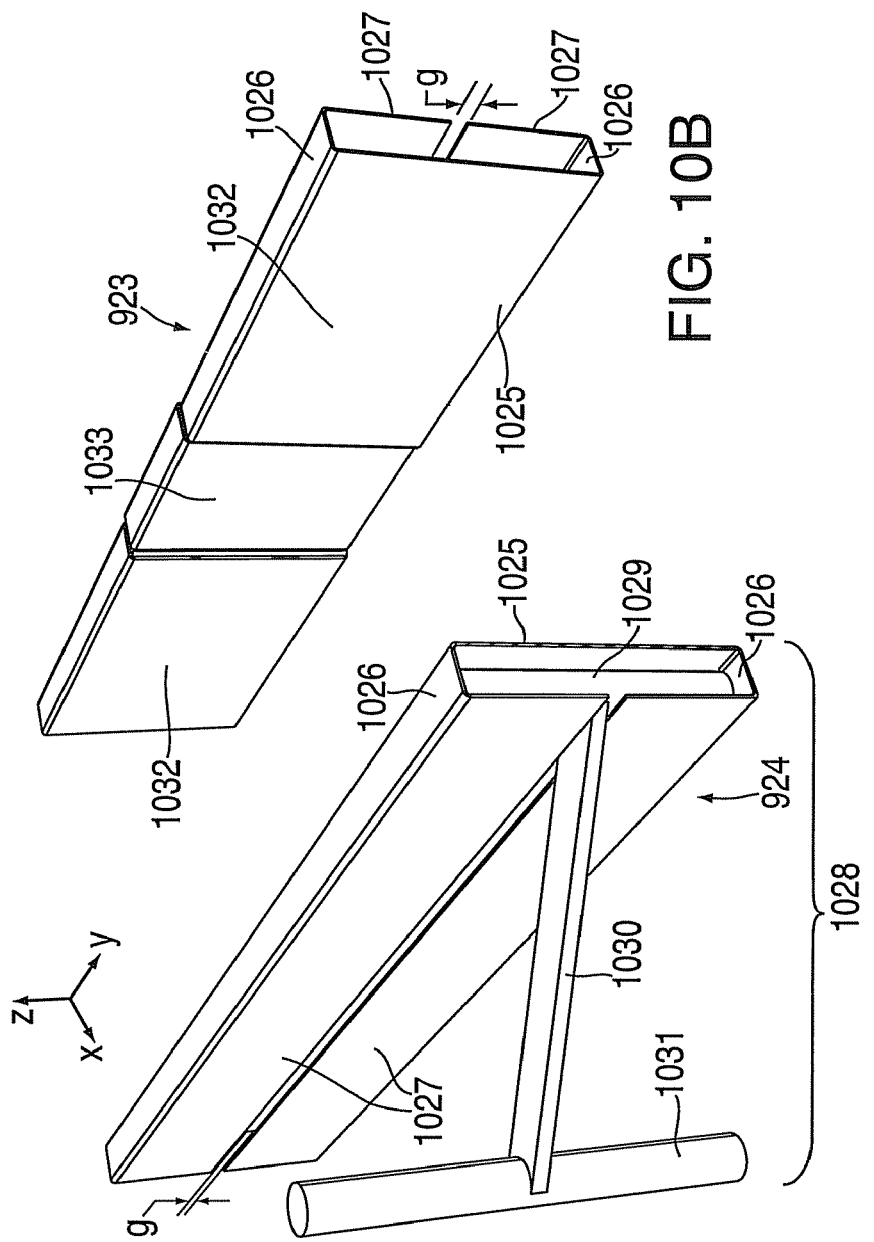

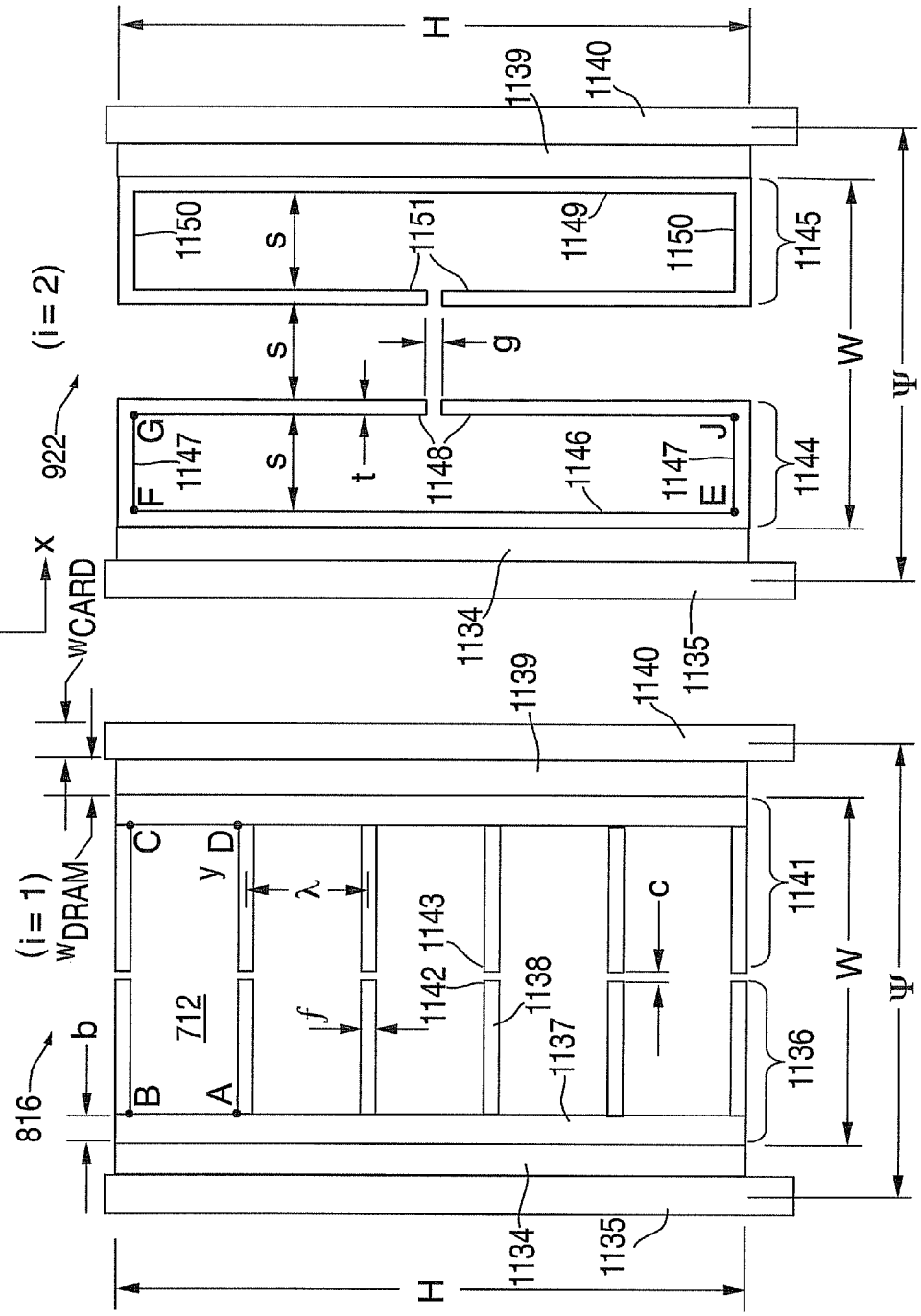

| Case # | Figure # (Geometry) | Figure # (Results) | DRAM Heatsink | Hub-Chip Heatsink | $\Delta T_F$: Front DRAM Max $\Delta T$ [°C] | $\Delta T_R$: Rear DRAM Max $\Delta T$ [°C] | $\Delta T_H$: Hub-Chip Max $\Delta T$ [°C] |
|---|---|---|---|---|---|---|---|
| 1 | 2 | 30 | None | Finned (Prior Art) | 59 | 59 | 37 |
| 2 | 3 | 31 | Monolithic Flat (Prior Art) | Finned (Prior Art) | 57 | 57 | 59 |
| 3 | 5 | 32 | Folded (Invention) | Finned (Prior Art) | 33 | 32 | 38 |
| 4 | 16 | 33 | Folded (Invention) | Finned (Prior Art) | 35 | 35 | 37 |

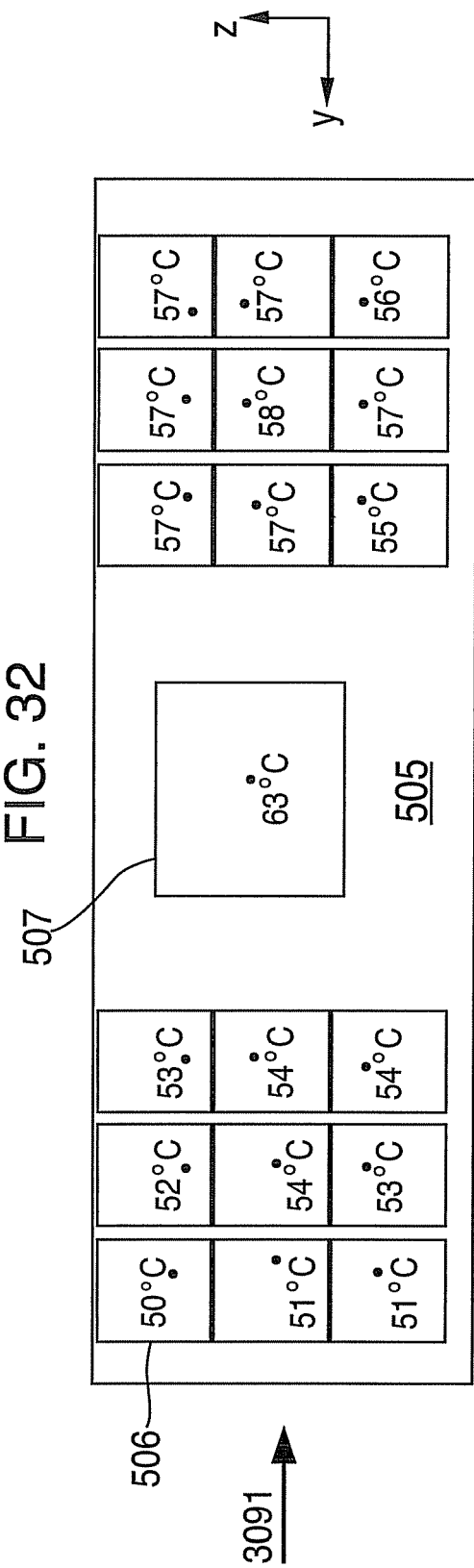
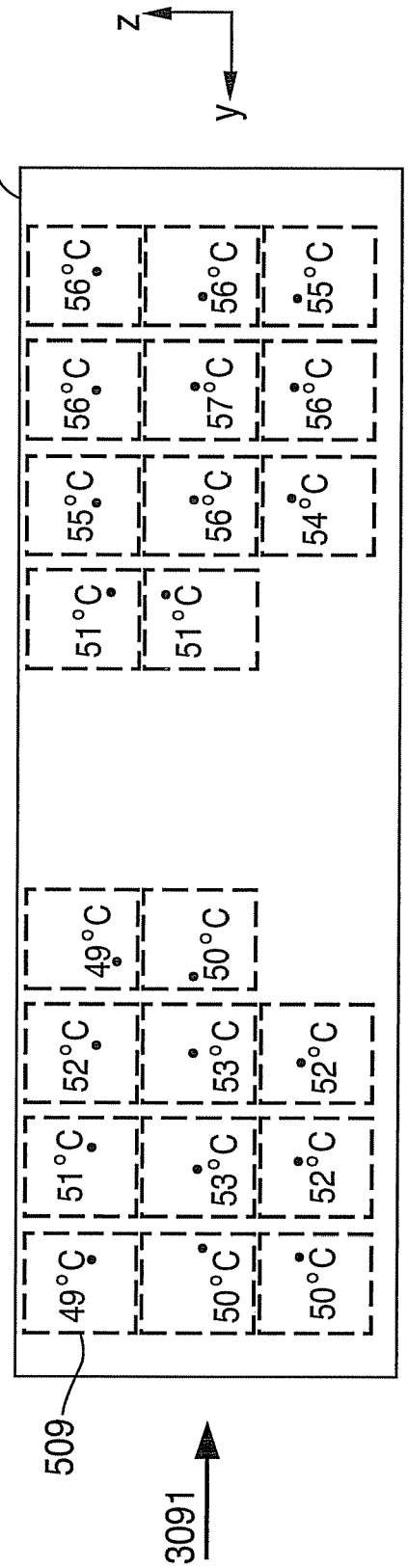
FIG. 32

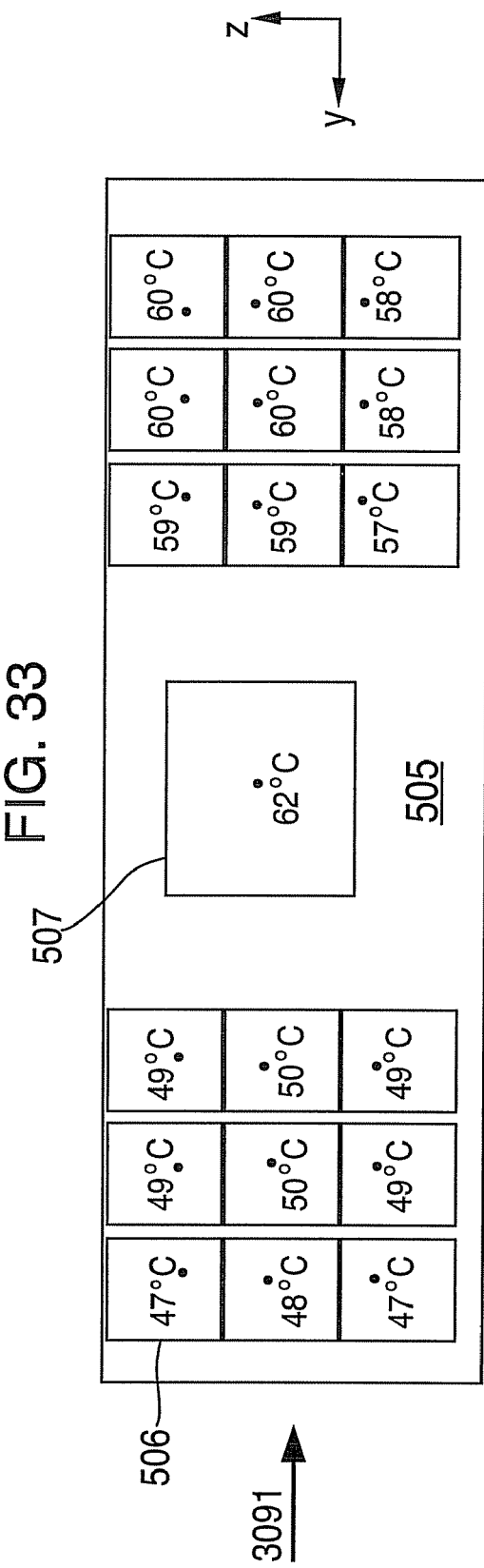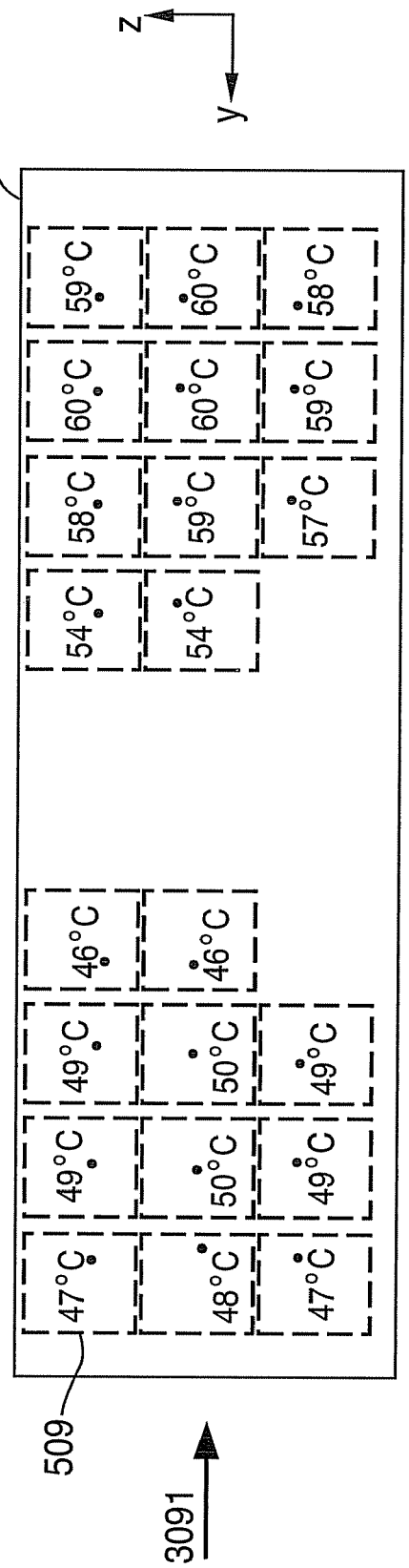
FIG. 33

FOLDED-SHEET-METAL HEATSINKS FOR CLOSELY PACKAGED HEAT-PRODUCING DEVICES

BACKGROUND OF THE INVENTION

This invention relates generally to cooling assembly components, and more particularly to a folded-sheet-metal heatsink for cooling closely packaged heat-producing devices.

Contemporary memory systems employed in high-performance computing machinery are generally composed of one or more dynamic random-access memory (DRAM) devices, which are connected to one or more processors via one or more memory control elements. Overall computer-system performance is affected by each of the key elements of the computer structure, including the performance/structure of the processor(s), any memory cache(s), the input/output (I/O) subsystem(s), the efficiency of the memory control function(s), the main memory device(s), and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems present further challenges relating to overall system reliability, because customers expect new computer systems to have markedly improved mean-time-between-failure (MTBF), and to offer additional functions, increased performance, increased storage, lower operating costs, simplified upgrade, and reduced environmental impact (such as space, power and cooling).

FIG. 1 relates to U.S. Pat. No. 5,513,135 to Dell et al., of common assignment herewith, and depicts an early synchronous memory module. The memory module depicted in FIG. 1 is a dual in-line memory module (DIMM). This module is composed of synchronous DRAMs 108, buffer devices 112, an optimized pinout, and an interconnect and capacitive decoupling method to facilitate high performance operation. The patent also describes the use of clock re-drive on the module, using such devices as phase-locked loops (PLLs).

FIG. 2 relates to U.S. Pat. No. 6,173,382 to Dell et al., of common assignment herewith, and depicts a computer system 210 which includes a synchronous memory module 220 that is directly (i.e. point-to-point) connected to a memory controller 214 via a bus 240, and which further includes logic circuitry 224 (such as an application specific integrated circuit, or "ASIC") that buffers, registers or otherwise acts on the address, data and control information that is received from the memory controller 214. The memory module 220 can be programmed to operate in a plurality of selectable or programmable modes by way of an independent bus, such as an inter-integrated circuit (I2C) control bus 234, either as part of the memory initialization process or during normal operation. When utilized in applications requiring more than a single memory module connected directly to a memory controller, the patent notes that the resulting stubs can be minimized through the use of field-effect transistor (FET) switches to electrically disconnect modules from the bus.

Relative to U.S. Pat. No. 5,513,135, U.S. Pat. No. 6,173,382 further demonstrates the capability of integrating all of the defined functions (address, command, data, presence detect, etc) into a single device. The integration of functions is a common industry practice that is enabled by technology improvements and, in this case, enables additional module density and/or functionality.

FIG. 3, from U.S. Pat. No. 6,510,100 to Grundon et al., of common assignment herewith, depicts a simplified diagram and description of a memory system 310 that includes up to four registered DIMMs 340 on a traditional multi-drop stub bus. The subsystem includes a memory controller 320, an external clock buffer 330, registered DIMMs 340, an address bus 350, a control bus 360 and a data bus 370 with terminators 395 on the address bus 350 and the data bus 370. Although only a single memory channel is shown in FIG. 3, systems produced with these modules often included more than one discrete memory channel from the memory controller, with each of the memory channels operated singly (when a single channel was populated with modules) or in parallel (when two or more channels where populated with modules) to achieve the desired system functionality and/or performance.

FIG. 4, from U.S. Pat. No. 6,587,912 to Bonella et al., depicts a synchronous memory module 410 and system structure in which the repeater hubs 420 include local re-drive of the address, command and data to the local memory devices 401 and 402 via buses 421 and 422; generation of a local clock (as described in other figures and the patent text); and the re-driving of the appropriate memory interface signals to the next module or component in the system via bus 400.

As is evident from the prior-art references, the computer and memory industries have continuously strived to maximize overall system performance and memory subsystem value by utilizing technology improvements (e.g., increased circuit density and reduced circuit power), increased functionality in the memory subsystem (enabled by these same factors), and alternate bus structures. However, one result of the increased memory-subsystem performance and function, in conjunction with the integration and use of hub devices and many external DRAM devices, is an increase in the amount of heat generated on the DIMM. Indeed, memory DIMMs today are observed to have heatsinks extending largely over the whole of the surface of the DIMM. However, due to factors such as an incomplete understanding of the nature of the heat flow, heatsinks to date have not typically been optimized. Consequently, overheating of one or more of the devices can occur, causing excessive failure rates due to exaggerated leakage of the DRAM devices, and also causing slower transistor switching times that in turn cause data upsets. Moreover, leakage currents in hub chips (also referred to as hub devices, buffer chips or buffer devices) and DRAMs are observed to increase with temperature, so that these devices draw even more power, and incur even higher temperatures, as a result of inadequate cooling. Higher temperatures can also increase the rate of corrosion, metal fatigue, and other physical processes that can eventually result in a memory DIMM failure and potential loss of data.

Therefore, the need exists for an improved heatsink design that can lower both the hub-chip and the DRAM temperatures. This improved design should ideally allow reduced spacing between DIMMs, and should not dramatically increase the air-pressure drop through the heatsink. Such a solution, by providing lower DRAM and hub-chip temperatures, would reduce the DIMM failure rate, leakage power, and therefore system-level cooling requirements. For all these reasons, such a solution would reduce system cost. Additional benefits would include increased operating and test margins.

BRIEF SUMMARY OF THE INVENTION

Embodiments include a folded heatsink for cooling heat-producing devices. The folded heatsink includes a substantially planar base having a first end and a second end. The base is intended to be affixed in thermal contact to an exposed substantially planar surface of one or more heat-producing devices. The folded heatsink also includes two shoulders each having a proximal end and a distal end. The proximal ends of the shoulders project substantially at right angles from the first and second ends of the base. The folded heatsink also includes two arms each having a proximal end and a distal end. The proximal ends of the arms project substantially at right angles from the distal ends of the shoulders such that the base, shoulders and arms from a nearly closed rectangular tube formed from a continuous sheet of metal.

Embodiments also include an assembly including one or more heat-producing devices each having an exposed, substantially planar surface. The assembly also includes a folded heatsink formed from a continuous sheet of metal for cooling the heat-producing devices. The folded heatsink includes a base having a first end and a second end. The base lies substantially parallel to the exposed substantially planar surface of one or more heat-producing devices. The base is affixed in thermal contact to the substantially planar surface of the one or more heat-producing devices. The folded heatsink also includes two shoulders each having a proximal end and a distal end. The proximal ends of the shoulders project substantially at right angles from the first and second ends of the base. The folded heatsink also includes two arms each having a proximal end and a distal end. The proximal ends of the arms project substantially at right angles from the distal ends of the shoulders such that the base, shoulders and arms from a nearly closed rectangular tube.

Embodiments also include a memory module including one or more heat-producing devices each having an exposed substantially planar surface. The heat-producing devices include a hub device and one or more memory devices. The memory module also includes a folded heatsink formed from a continuous sheet of metal for cooling the heat-producing devices. The folded heatsink includes a base having a first end and a second end. The base lies substantially parallel to the exposed substantially planar surface of one or more heat-producing devices. The base is affixed in thermal contact to the substantially planar surface of the one or more heat-producing devices. The folded heatsink also includes two shoulders each having a proximal end and a distal end. The proximal ends of the shoulders project substantially at right angles from the first and second ends of the base. The folded heatsink also includes two arms each having a proximal end and a distal end. The proximal ends of the arms project substantially at right angles from the distal ends of the shoulders such that the base, shoulders and arms from a nearly closed rectangular tube.

Further embodiments include a folded heatsink for cooling heat-producing devices. The folded heatsink includes a substantially planar base intended to be affixed in thermal contact to an exposed, substantially planar surface of a heat-producing device. The folded heatsink also includes a plurality of corrugations in contact with the base for forming closed air-flow channels. Each of the corrugations includes a riser, a roof, a descender and a foot. The riser has a proximal end and a distal end. The proximal end of the riser projects substantially at a right angle from the base. The roof has a proximal end and a distal end with the proximal end of the roof projecting substantially at a right angle from the distal end of the riser. The descender has a proximal end and a distal end with the proximal end of the descender projecting substantially at a right angle from the distal end of the roof, and extending toward the base. The foot, which is parallel to the base and in contact with it, has a proximal end and a distal end, with the proximal end of the foot projecting substantially at a right angle from the distal end of the descender. The distal end of the foot is in contact with proximal end of the next riser. The folded heatsink is formed from a continuous sheet of metal.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

Referring now to the drawings wherein like elements are numbered alike in the several FIGURES:

FIGS. 5A and 5B illustrate the front and back side views of an exemplary memory module;

FIGS. 7A, 7B and 7C depict an exemplary cooling arrangement that utilizes flat heatsinks;

FIGS. 8A, 8B and 8C depict an exemplary cooling arrangement that utilizes finned heatsinks attached to all major components on the modules;

FIGS. 9A, 9B and 9C depict a folded heatsink cooling arrangement that may be implemented by exemplary embodiments of the present invention;

FIGS. 10A and 10B depict a folded heatsink and an installment tool that may be implemented by exemplary embodiments;

FIGS. 11A and 11B depict an exemplary finned heatsink cooling arrangement and an exemplary folded heatsink cooling arrangement;

FIGS. 29-33 depict the results of simulations of the cooling effectiveness of exemplary heatsinks.

DETAILED DESCRIPTION OF EXEMPLARY EMBODIMENTS

Figure 1:
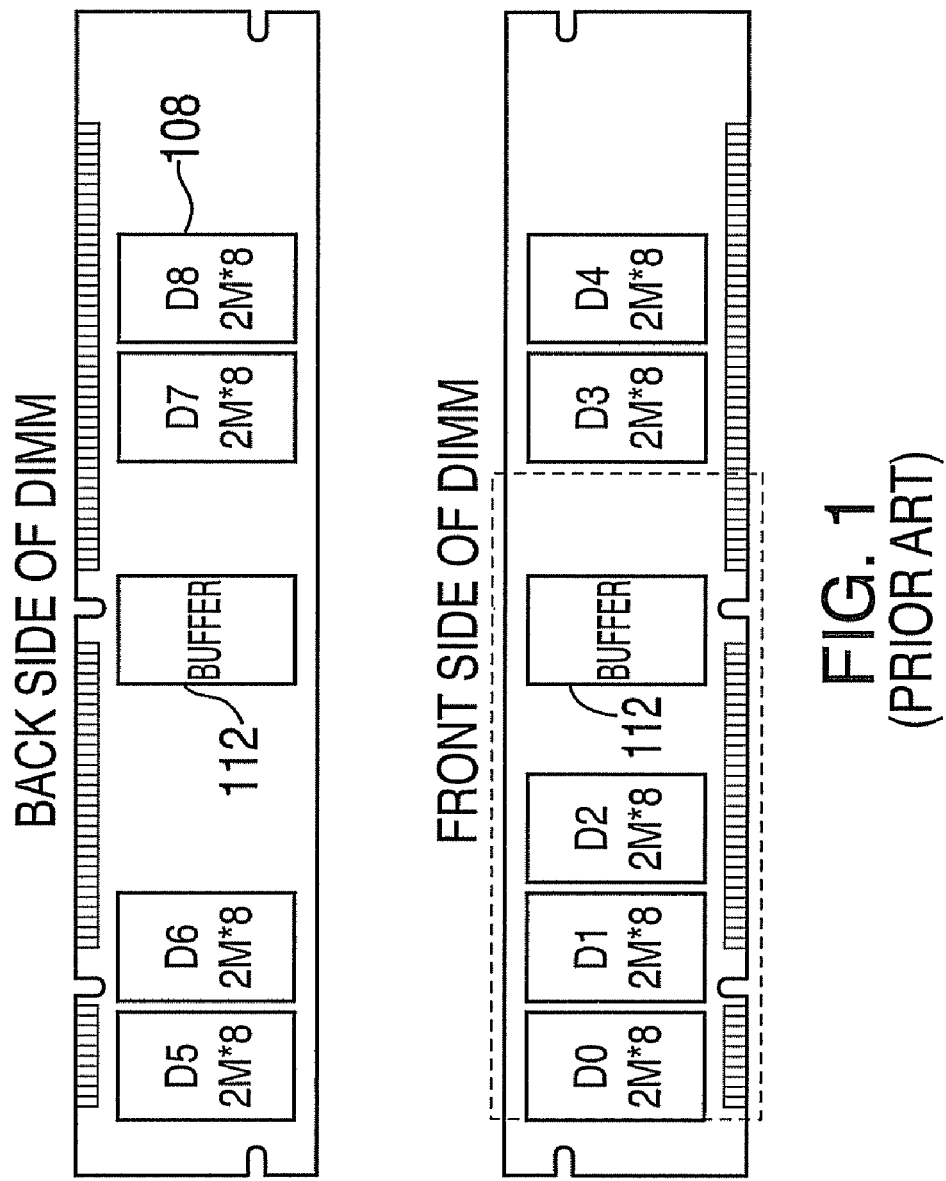
FIG. 1 depicts an exemplary early synchronous memory module.
Figure 2:
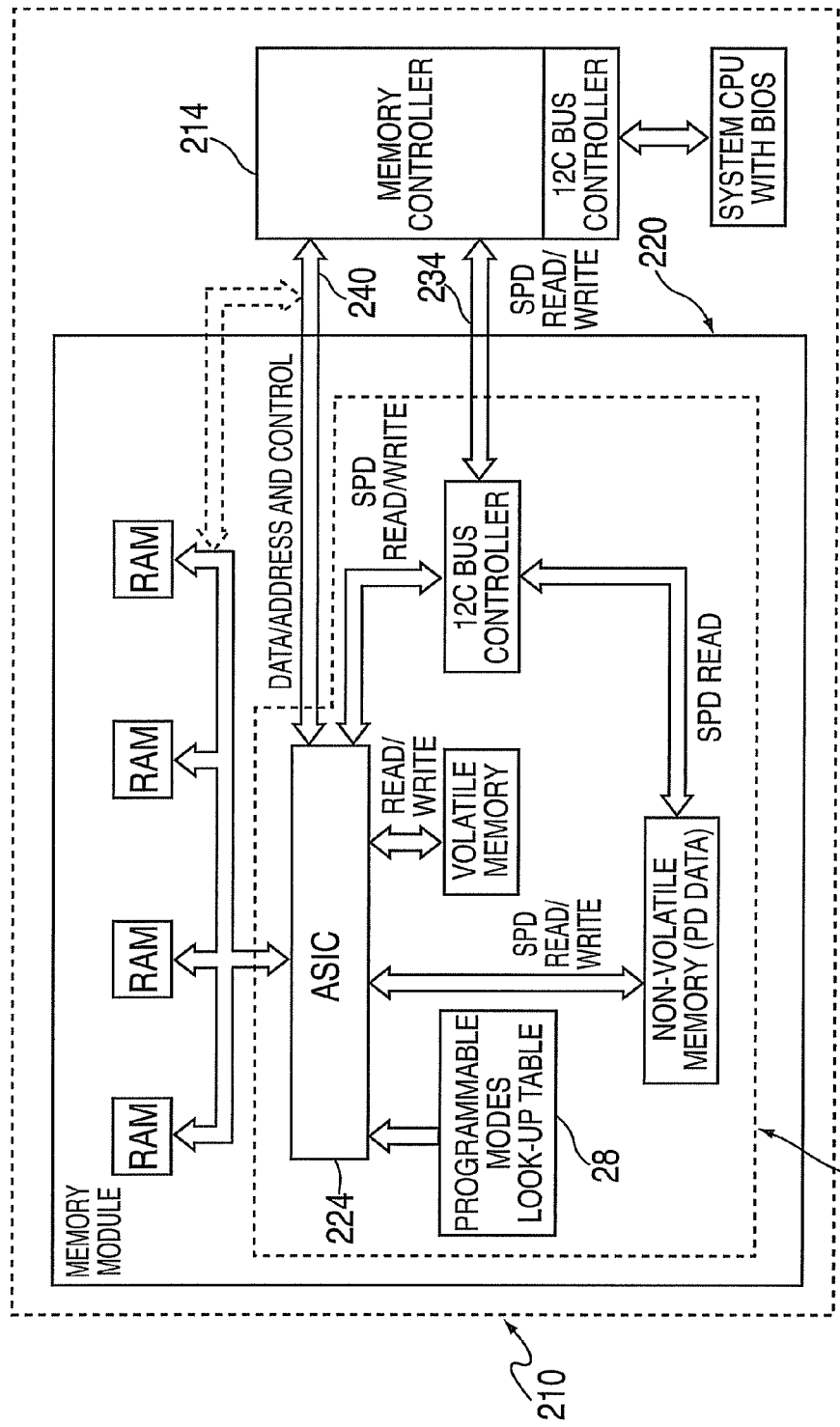
FIG. 2 depicts an exemplary computer system with a fully buffered synchronous memory module that is directly connected to a memory controller.
Figure 3:
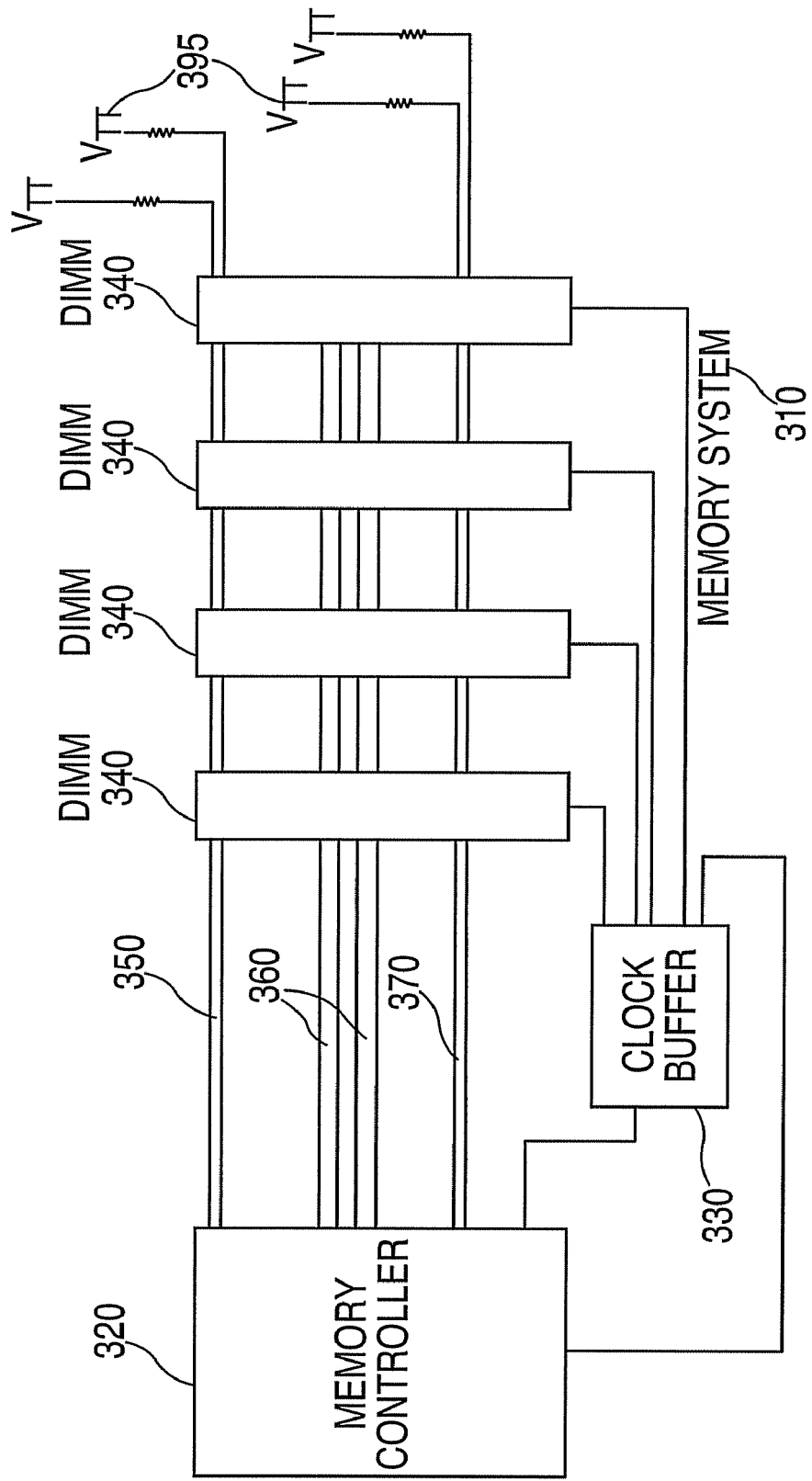
FIG. 3 depicts an exemplary memory system, shown with a single, traditional multi-drop stub bus.
Figure 4:
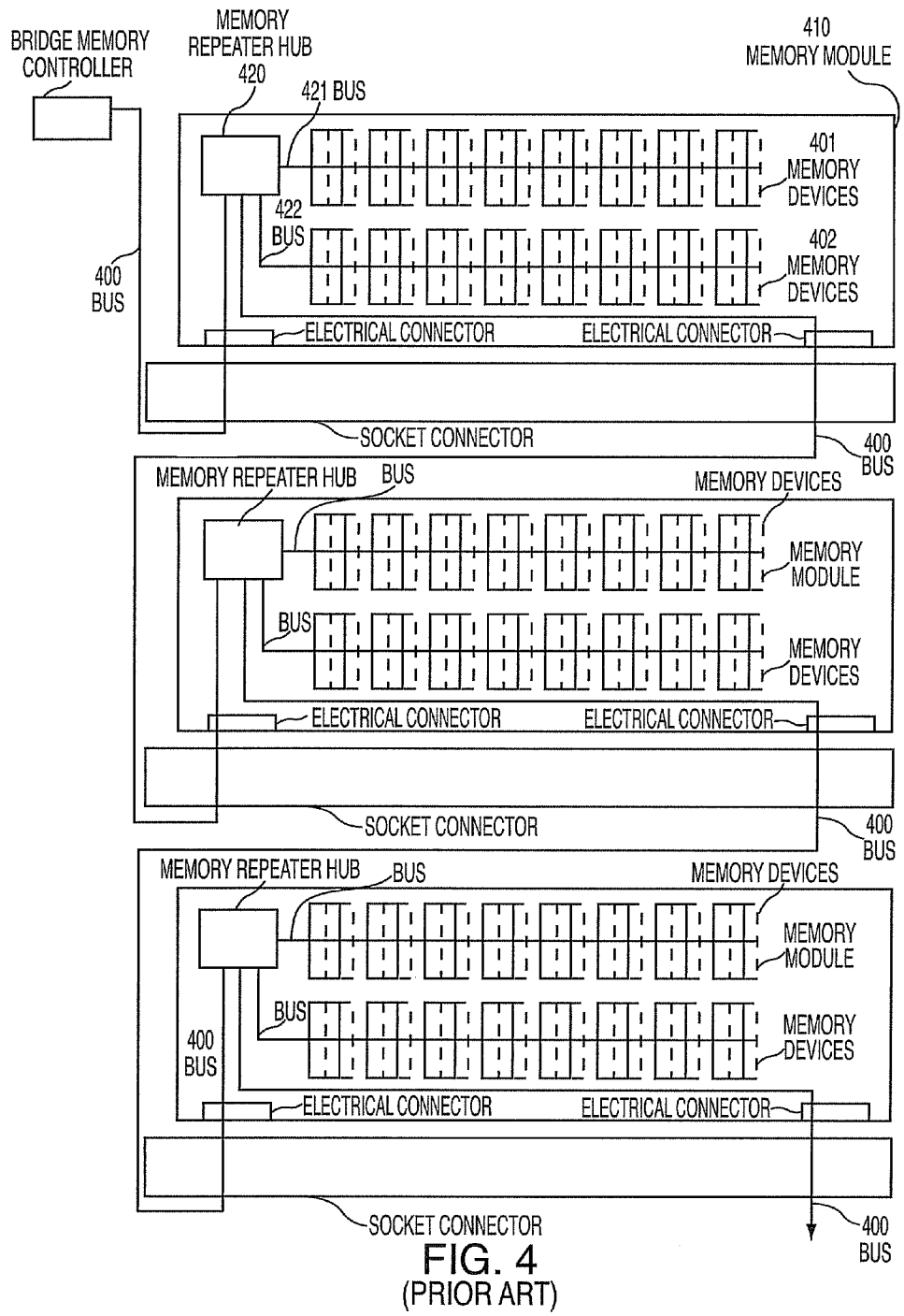
FIG. 4 depicts a fully buffered synchronous memory module and system structure, where the fully buffered synchronous memory module includes a repeater function.

Exemplary embodiments are directed to folded-sheet-metal heatsinks that are economical to manufacture and that provide a reduction in operating temperatures of closely packaged heat-producing devices. Exemplary embodiments relate generally to systems, or assemblies, in which heat-producing devices that are packaged closely together must be cooled. One important commercial example of such an assembly is a memory system for computers, where a plurality of dual-in-line memory modules (DIMMs) must be packaged closely together, and each DIMM carries a plurality of heat-producing memory devices such as dynamic random-access memory (DRAM) chips and possibly also a heat-producing hub chip, clock chip or other active device(s). Consequently, embodiments described below use the example of DIMM modules to exemplify the invention, but it is to be understood that the invention may also be applied to other memory and non-memory applications. Examples of other memory assemblies where exemplary embodiments may be applied include memory modules such as SIMMs (Single Inline Memory Modules), TRIMMs (Triple Inline Memory Modules), QUIMMs (Quad Inline Memory Modules) and other memory assemblies having a wide range of length, width and thickness variations based on system physical and environmental needs. Non-memory assemblies may include processor, communications, adapter and other I/O (input/output) cards, which may include embodiments attached to all or a portion of the assembly. Exemplary embodiments may further be applied to one or more discrete devices within a subsystem or system environment, as a means of maximizing heat transfer from heat-producing devices such as processors, buffers, hubs, interface devices, storage devices or other integrated devices operating in environments wherein the exemplary embodiments offer optimal cost/performance.

Exemplary embodiments include a simple, inexpensive, folded-sheet-metal heatsink that can be used to reduce the operating temperatures of closely spaced heat-producing devices, such as DRAMs, buffers, hubs, registers, PLLs and other devices on closely-spaced memory DIMMs. In exemplary embodiments, the folded-sheet-metal heatsink spans multiple DRAM chips and optionally, the hub chip as well. The folded-sheet-metal heatsink contains additional cooling surfaces other than the one in contact with the devices. In addition, the folded-sheet-metal heatsink is constructed using sheet-metal forming operations well known in the art, or by other well-known means such as casting or extrusion. Exemplary embodiments described herein facilitate the attachment of the heatsink with a thermal interface material to the devices to be cooled.

Exemplary embodiments are described below and are contrasted to conventional heatsink by a number of perspective drawings. Each figure is accompanied by a Cartesian xyz coordinate system that clarifies spatial orientation, inasmuch as the xyz directions shown in all figures are mutually consistent.

FIGS. 5A and 5B illustrate the front and back side views of a typical DIMM. FIGS. 5A and 5B each show a view of a system circuit board 501 with a DIMM connector 502, into which is plugged a DIMM circuit card 503 that is retained within the DIMM connector 502 by retention handles 504. Upon a front surface 505 of the DIMM circuit card 503 is mounted a plurality of front DRAMs 506 and possibly also one or more hub chips 507, or hub chip devices. Upon a rear surface 508 of the DIMM circuit card 503 may optionally be mounted a plurality of rear DRAMs 509. Both the front DRAMs 506 and the rear DRAMs 509 are electrically connected to the hub chip(s) 507 through wiring within the DIMM circuit card 503. To cool the DRAMs (including the front DRAMS 506 and the rear DRAMS 509) and the hub chip(s) 507, air flows in the +y direction.

Figure 6:
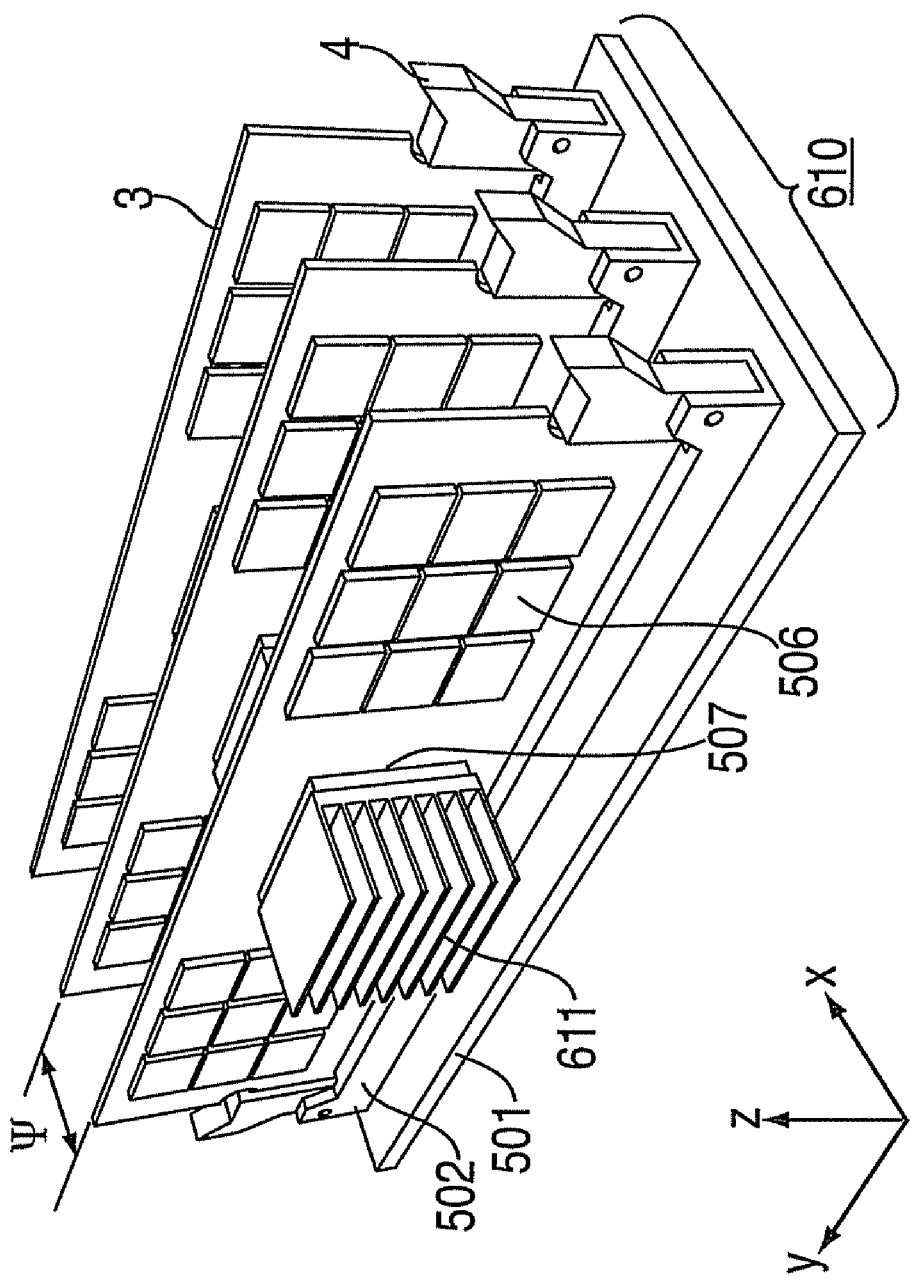
FIG. 6 illustrates exemplary memory modules that include finned heatsinks attached to buffer devices located on the modules.

FIG. 6 illustrates how the DIMMs of FIGS. 5A and 5B are typically packaged closely together in a row of DIMMs 610, with a card-to-card pitch $\Psi$. In such an arrangement, the hub chip 507 may, depending on its power, have a hub chip heatsink, such as finned heatsink 611, attached to its top surface. Typical DIMMS do not employ heatsinks on DRAM devices (e.g., front DRAMS 506 and back DRAMS 509). An exception may exist in the newest family of standard high-speed memory modules, known as JEDEC-standard FB-DIMMs (fully buffered DIMMs), which, in some instances, dissipate enough power to require heatsinks on the DRAM devices.

In an attempt to satisfy this FB-DIMM requirement, a cooling arrangement with flat heatsinks 712, such as that shown in three views as FIGS. 7A, 7B, and 7C, may be utilized. The flat-heatsink cooling arrangement 712 uses flat heatsinks 713 that extend over the whole of the DIMM circuit card 503, as a single U-shaped sheet, a first portion 714 of which acts as a heatsink for the front DRAMs 506 and hub chip 507 (as shown in FIGS. 5 and 6), and a second portion 715 of which acts as a heatsink for the rear DRAMs 509. Alternatively, such a flat heatsink 713 may be made of two parts, one on the front and one on the back of the DIMM circuit card 503. One concern that has been identified by the industry, related to the cooling arrangement depicted in FIGS. 7A, 7B and 7C is related to deformation of the flat heatsink 713, directly over regions not populated by the larger devices such as DRAMs, hubs, PLLs or other components. When deformation occurs, such as that resulting from physical pressure applied during handling, insertion or removal of the module (e.g., a DIMM circuit card 503), it is possible that the underside of the flat heatsink 713 may make contact with one or more conductive surfaces having differing voltage potentials—resulting in an undesired conductive path and the potential for component, module or system damage.

Another finned-heatsink cooling arrangement 816, shown in FIGS. 8A, 8B, and 8C, uses four traditional finned heatsinks, including a hub chip finned heatsink 817, two front DRAM finned heatsinks 818, and a rear DRAM finned heatsink 819. Each finned heatsink, typically made by extrusion, includes a finned heatsink base 820 and a series of fins 821.

In contrast to the flat-heatsink cooling arrangement 712 and the finned-heatsink cooling arrangement 816, exemplary embodiments of the present invention are directed to a folded-heatsink cooling arrangement 922 such as the one depicted in FIGS. 9A, 9B, and 9C. On each DIMM circuit card 503, a front folded heatsink 923 cools the front DRAMs 506 and the hub chip 507 that populate the front surface 505 of the DIMM circuit card 503, and a rear folded heatsink 924 cools the rear DRAMs 509 that populate the rear surface 508 of the DIMM circuit card 503. Both the front folded heatsink 923 and the rear folded heatsink 924 are made of a single piece of folded sheet metal (e.g., copper or aluminum).

As shown in FIG. 10A, exemplary embodiments of the rear folded heatsink 924 include five folded sheet-metal segments: a base 1025, two shoulders 1026, and two arms 1027. The distal ends of the arms 1027 face each other and are separated by a small gap g. During the heatsink installation process, when the heatsink's base 1025 is affixed to the heat-producing devices (e.g., by means of an adhesive layer), the gap g is used to insert a tool 1028 (e.g., shaped like a squeegee) that applies the normal force required to achieve a relatively thin layer of adhesive having minimal thermal resistance. The tool 1028 includes a cylindrical force-applicator bar 1029 that applies the normal force, a strut 1030 connected thereto whose rectangular cross-section is sized relative to the gap g to allow the tool 1028 to slide in the y direction such that the normal force may be applied to the full y length of the folded heatsink base 1025. In alternate exemplary embodiments, the tool also includes a handle 1031 to facilitate manual or automated use of the tool 1028.

As shown in FIG. 10B, exemplary embodiments of the front folded heatsink 923 include a base 1025, two shoulders 1026, two arms 1027, and a gap g. In exemplary embodiments, the front folded heatsink 923 is slightly more complicated because it has three folded segments, including two DRAM segments 1032 and one buffer or hub chip segment 1033. In exemplary embodiments, the two DRAM segments 1032 are co-planar, but the hub chip segment 1033 lies in a different plane due to the hub chip 507 having a different thickness than the DRAM chips.

The exemplary embodiment of FIG. 10B includes a folded heatsink, such as the front folded heatsink 923, for cooling heat-producing devices. The front folded heatsink 923 in FIG. 10B includes a base 1025 being substantially planar and having a first end and a second end for affixing in thermal contact to an exposed substantially planar surface of one or more heat producing devices. The front folded heatsink 923 also includes two shoulders 1026 each having a proximal end and a distal end, with the proximal ends of the shoulders 1026 projecting substantially at right angles from the first and second ends of the base 1025. The front folded heatsink 923 further includes two arms 1027 each having a proximal end and a distal end. The proximal ends of the arms 1027 project substantially at right angles from the distal ends of the shoulders 1026 such that the base 1025, shoulders 1026 and arms 1027 form a nearly closed (separated by a gap, "g") rectangular tube formed from a continuous sheet of metal.

When compared to conventional heatsinks (e.g., flat heatsinks and finned heatsinks), exemplary embodiments of the present invention that include the front folded heatsink 923 and the rear folded heatsink 924 provide more heatsink area exposed to the cooling fluid (e.g., air), particularly at small values of card-to-card pitch $\Psi$. This enhances the convection of heat from heatsink to air without compromising the packaging density of the devices on the DIMM circuit cards 503 or of the DIMM circuit cards 503 themselves. In addition, exemplary embodiments provide a thermally conductive path between one or more of the heat-producing components (e.g., front DRAM 506, hub chip 507, and rear DRAM 509) to promote heat spreading among these components, some of which may otherwise be hotter than others. Further, exemplary embodiments of the front folded heatsink 923 and the rear folded heatsink 924 allow for an inexpensive means of heatsink fabrication and attachment. Exemplary embodiments also allow, during a heatsink-attachment process, the application of a compressive force across an adhesive layer applied between the heatsink and the heat-producing components, to ensure good adhesion as required to produce low conductive thermal resistance, and thus to achieve lower temperatures of the heat-producing components (e.g., front DRAM 506, hub chip 507, and rear DRAM 509).

The flat-heatsink cooling arrangement 712 and the finned-heatsink cooling arrangement 816 do not provide for as much of the heatsink area being exposed to the cooling fluid as exemplary embodiments of the present invention, such as the one depicted in FIG. 9. Exemplary embodiments, such as the folded-heatsink cooling arrangement 922, as depicted in FIG. 9, have roughly three times the wetted area contained in the flat-heatsink cooling arrangement 712. Finned-heatsinks such as 818 and 819 are traditionally very effective at achieving a maximum amount of wetted area. Indeed, when the card-to-card pitch $\Psi$ is large, the finned-heatsink cooling arrangement 816 may provide better cooling than the folded-heatsink cooling arrangement 922.

However, as the card-to-card pitch $\Psi$ becomes smaller, the thickness of the finned heatsink base 820 (as illustrated, for example, by dimension "b" in FIG. 11A) becomes an appreciable fraction of the total x space available, resulting in very short fins 821 that are quite ineffective at contributing appreciable wetted area. Moreover, the thick finned heatsink bases 820 of traditional finned heatsinks reduce the space available for the cooling fluid, thus creating unnecessary pressure drop through the heatsink. Although thinner finned heatsink bases 820 would be desirable for better thermal performance, economical manufacturing processes that produce finned heatsinks, such as extrusion, cannot typically achieve finned heatsink bases 820 thinner than 1.0 mm. In addition, such manufacturing processes also cannot typically achieve heatsink fins 821 having thickness smaller than about 0.5 mm, so more airflow space is wasted on unnecessarily thick fins 821.

In contrast, the sheet metal of which exemplary embodiments of the folded heatsinks 922 (e.g., including the front folded heatsink 923 and the rear folded heatsink 924) of the present invention may be formed is readily obtainable in a wide variety of thicknesses as small as 0.01 mm, so the folded heatsinks need not waste space in the x direction on unnecessarily thick bases 1025, shoulders 1026, or arms 1027. In exemplary embodiments of the folded heatsinks, the metal only need be thick enough to conduct heat effectively from base 1025 to arms 1027 so as not to impede convection. Consequently, for small values of card-to-card pitch $\Psi$, exemplary embodiments of the folded heatsinks of the present invention provide considerably larger wetted area and increased airflow area, thus lower convective thermal resistance and lower pressure drop, both of which lead to lower temperatures of the heat-producing devices such as the DRAM(s) and hub chip(s) 507.

Mathematical Analysis Comparing Finned Heatsinks to Folded Heatsinks

The above observations about the relative cooling capabilities of conventional finned heatsinks and exemplary embodiments of the folded heatsinks of the present invention are quantified in the following mathematical analysis, which specifies a range of parameters over which exemplary embodiments of the folded heatsinks have superior thermal performance to finned heatsinks. The following analysis compares the finned-heatsink cooling arrangement 816, shown schematically in FIG. 11A, to the folded-heatsink cooling arrangement 922, shown schematically in FIG. 11B, the latter being an exemplary embodiment of the present invention.

The exemplary embodiment of FIG. 11B includes an assembly with one or more heat-producing devices 1134–1139 each having an exposed, substantially planar surface. The assembly also includes a folded heatsink, such as the first folded heatsink 1144 (or the second folded heatsink 1145), formed from a continuous sheet of metal for cooling the heat-producing devices 1134. The first folded heatsink 1144 includes a base 1146 having a first end and a second end. The base 1146 lies substantially parallel to the exposed substantially planar surface of one or more heat-producing devices 1134. The base 1146 is affixed in thermal contact to the substantially planar surface of the one or more heat-producing devices 1134. The first folded heatsink 1144 also includes two shoulders 1147 each having a proximal end and a distal end. The proximal ends of the shoulders 1147 project substantially at right angles from the first and second ends of the base 1146. The first folded heatsink 1144 also includes two arms 1148 each having a proximal end and a distal end. The proximal ends of the arms 1148 project substantially at right angles from the distal ends of the shoulders 1147 such that the base 1146, shoulders 1147 and arms 1148 from a nearly closed (separated by a gap, "g") rectangular tube. In exemplary embodiments, the assembly is a memory module (e.g., a DIMM circuit card 503) and the heat-producing devices 1134 1139 include a hub chip 507 (or hub device) and one or more DRAMs 506 509 (or memory devices), such as the configuration shown in FIGS. 5A and 5B.

Referring to FIG. 11A and the accompanying xz Cartesian coordinate system, the finned-heatsink cooling arrangement 816 includes a first heat-producing device 1134 (e.g., a DRAM), lying on the +x face of a first electrical circuit card 1135 (e.g., a DIMM circuit card 503), which is conventionally air cooled using a first finned heatsink 1136, whose base 1137 has thickness b in the x direction and a total height H in the y direction, and whose fins 1138, each having fin thickness f, are spaced along the z direction with a fin-to-fin pitch λ. Consequently, the number N of fins 1138 that fit on the first finned heatsink 1136 is $$N = \frac{H-f}{\lambda} + 1, \qquad (1)$$

where f and λ must be chosen to produce an integer value for N.

The finned-heatsink cooling arrangement 816 further includes a second heat-producing device 1139 lying on the −x face of a second electrical circuit card 1140, and cooled by a second finned heatsink 1141 that is identical in all respects to the first finned heatsink 1136, such that fin tips 1142 of the first finned heatsink 1136 face fin tips 1143 of the second heatsink 1141, with a small clearance c between them, causing the two heatsinks 1136 and 1141 to occupy, in the x direction, a total width W.

FIG. 11B depicts an exemplary embodiment of the present invention that includes a folded-heatsink cooling arrangement 922. FIG. 11B includes electrical circuit cards 1135, 1140 and heat-producing devices 1134, 1139 similar to those in the finned-heatsink cooling arrangement 816, but replaces the conventional first finned heatsink 1136 and second finned heatsink 1141 with a first folded heatsink 1144 and a second folded heatsink 1145. Made of a single piece of sheet metal having thickness t, the first folded heatsink 1144 includes a base 1146, two shoulders 1147, and two arms 1148 whose ends are separated by a gap g. Similarly, the second folded heatsink 1145 includes a base 1149, two shoulders 1150, and two arms 1151 whose ends are separated by gap g. Like the finned heatsinks in FIG. 11A, the folded heatsinks (e.g., the first folded heatsink 1144 and the second folded sink 1145) in FIG. 11B are confined in the y direction by total height H, and in the x direction by total width W. For the folded heatsinks, width W is allocated as shown, such that the same space s, to be used for the flow of cooling fluid, exists between each of the folded heatsinks' bases 1146, 1149, and their arms 1148, 1151, where $$s = \frac{W-4t}{3}. \qquad (2)$$

An objective of the following analysis is to demonstrate mathematically that exemplary embodiments of the present invention, including the folded-heatsink cooling arrangement 922, have an intrinsic advantage in cooling performance over the conventional finned-heatsink cooling arrangement 816, at least under the following conditions: (1) the total width W available for two heatsinks is limited; and (2) manufacturing processes such as extrusion, which are typically used to form the conventional finned heatsink, impose lower bounds on the values of base thickness b and fin thickness f.

Equal-Pressure-Drop Criterion

Comparison between exemplary embodiments of the folded-heatsink cooling arrangement 922 and the finned-heatsink cooling arrangement 816 is meaningful only if the fin pitch λ of the finned-heatsink cooling arrangement 816 is adjusted so that, at a given total volumetric flow rate V of cooling fluid, the total pressure drop $\Delta p_1$ across the finned-heatsink cooling arrangement 816 matches the total pressure drop $\Delta p_2$ across the folded-heatsink cooling arrangement 922; that is, if the equal-pressure-drop criterion $$\Delta p_1 = \Delta p_2 \qquad (3)$$

is imposed. For simplicity, the subscripts i=1 and i=2 are used to refer to the two heatsink arrangements 816 and 922, respectively, and thus these arrangements will be referred to henceforth in this mathematical analysis as "arrangement 1" and "arrangement 2", respectively.

For both heatsink arrangements, the total flow rate V is assumed to approach the heatsinks at a velocity $U_0$ that is uniform over the entire area of dimensions Ψ×H, where the relationship between $U_0$ and V is $$V = U_0 \Psi H. \qquad (4)$$

In the latter equation, referring to FIG. 11A, $$\Psi = W + w_{CARD} + 2w_{DRAM}. \qquad (5)$$

In exemplary DIMM applications, $w_{CARD}$=1.27 mm and $w_{DRAM}$=1.0 mm. Total pressure drop $\Delta p_i$ is the sum of a skin-friction-drag component $\Delta p_{i,SKIN}$ and a form-drag component $\Delta p_{i,FORM}$, $$\Delta p_i = \Delta p_{i,SKIN} + \Delta p_{i,FORM}, \qquad (6)$$

where the skin-friction-drag component is computed by considering the flow through the length of a heatsink channel, whereas the form-drag component is computed by considering a heatsink to be a screen having a certain percent-open area. The two terms on the right-hand side of equation (6) are considered in sequence.

First, consider $\Delta p_{i,SKIN}$. For heatsink arrangement 1 in FIG. 11A, $\Delta p_{1,SKIN}$ may be computed by considering the flow through one of arrangement 1's N−1 heatsinks channels, such as that bounded by points ABCD in FIG. 11A. Assuming that the total volumetric flow rate V is divided equally among the N−1 identical channels in FIG. 11A, the flow per channel is $$V_1 \equiv \frac{V}{N-1}. \tag{7}$$

Likewise, pressure drop $\Delta p_{2,SKIN}$ may be computed by considering the flow through one of arrangement 2's three heatsink channels, such as that bounded by points EFGJ in FIG. 11B. Assuming that the total volumetric flow rate V is divided equally among the three identical channels in FIG. 11B, the flow per channel is $$V_2 \equiv \frac{V}{3}. \tag{8}$$

As is well known in the art of hydraulics, an important property of any flow channel's cross section is its hydraulic diameter d, defined as four times its area divided by its perimeter. The hydraulic diameter $d_1$ of cross section ABCD is $$d_1 = \frac{2(W-2b)(\lambda-f)}{(W-2b)+(\lambda-f)}, \tag{9}$$

and the hydraulic diameter $d_2$ of cross section EFGJ is $$d_2 = \frac{2s(H-2t)}{s+(H-2t)}. \tag{10}$$

Another well-known property of flow through a channel is the bulk velocity, $$U_i \equiv \frac{V_i}{A_i}, \tag{11}$$

where $A_i$ is the channel's cross-sectional area. By inspection of FIGS. 11A and 11B, the cross-sectional area of each channel in the two cases i=1, 2 are $$A_1 = (\lambda-f)(W-2b), \tag{12}$$

$$A_2 = s(H-2t). \tag{13}$$

Yet another well-known property of flow through a channel is the dimensionless Reynolds number, $$Re_i \equiv \frac{\rho U_i d_i}{\mu} = \frac{\rho V_i d_i}{\mu A_i}, \tag{14}$$

where $\rho$ is the density of the cooling fluid and $\mu$ is its viscosity.

In terms of these definitions, the pressure drop per unit length of a channel, in either arrangement 1 or 2, may be written in well-known form as $$\Delta p_{i,SKIN} = \left(\frac{1}{2}\rho U_i^2\right)\left(\frac{L}{d_i}\right)\left(\frac{64}{Re_i}\right), \tag{15}$$

where the last factor of equation (15) assumes $Re_i \leq 2300$ (i.e., laminar flow), as is true for many applications of interest for exemplary embodiments of this invention.

Next, consider $\Delta p_{1,FORM}$, the pressure drop due to form drag. For non-solid bodies such as an array of DIMM cards, pressure drop due to form drag may be estimated from the following formula:

$$\Delta p_{i,FORM} = \frac{1}{2}\rho U_0^2 \frac{(K-\theta_i)^2}{\theta_i^2}, \tag{16}$$

where, for heatsink arrangement i, $\theta_i$ is the fraction of the total cross sectional area that is open, and K is an empirical constant that differs for various types of bluff objects comprising the "non-solid body". For rounded objects, K=1.0; for sharp objects, K=1.5. For numerical results herein, an intermediate value, K=1.25, is selected. This choice of K affects the number of finned-heatsink fins N* that will be deemed to produce the same pressure drop as the folded heatsinks. For example, in the numerical example given later where b=1.0 mm and f=0.50 mm, changing K from 1.25 to 1.50 reduces the number of finned-heatsink fins by one when W=15 mm or by two when W=5 mm. For the same parameters, changing K from 1.25 to 1.50 increases the number of finned-heatsink fins by one when W=15 mm and when W=5 mm.

For each heatsink arrangement, $\theta_i$ is calculated as the open area within the rectangle of dimensions $\Psi \times H$, divided by the total area $\Psi H$. From FIGS. 11A and 11B, $$\theta_1 = \frac{(N-1)(\lambda-f)(W-2b)}{\Psi H}, \tag{17}$$

$$\theta_2 = \frac{3s(H-2t)}{\Psi H}. \tag{18}$$

Substitution of equations (17) and (18) into (16) gives $\Delta p_{1,FORM}$ and $\Delta p_{2,FORM}$. Substitution of equations (7) through (14) into (15) gives $\Delta p_{1,SKIN}$ and $\Delta p_{2,SKIN}$. Substitution of these values into the equal-pressure-loss equation implied by (3) and (6), $$\Delta p_{1,SKIN} + \Delta p_{1,FORM} = \Delta p_{2,SKIN} + \Delta p_{2,FORM}, \tag{19}$$

yields a nonlinear algebraic equation in the fin pitch $\lambda$, inasmuch as both terms on the left hand side of (19) are functions of $\lambda$. For given fluid properties $\mu$, $\rho$ and for a given set of dimensions W, H, b, f, c, t and g, this equation may be solved numerically by Newton iteration to find the value of the fin pitch $\lambda$ in arrangement 1 that incurs the same pressure drop as the folded heatsinks in arrangement 2.

For such a computation, L and V must also be specified. A typical value of L for applications of interest to exemplary embodiments of the present invention that are utilized in memory systems and therefore, used in subsequent calculations, is L=100 mm. A typical value of V for applications of interest to exemplary embodiments of the present invention is computed from equation (4), $V = U_0 \Psi H$, where the approach velocity $U_0$ is typically 2.0 to 3.0 m/s. In subsequent calculations, the value $U_0$=2.5 m/s is adopted.

Modifying the Equal-Pressure-Drop Criterion to Produce an Integral Number of Fins Choosing fin-pitch $\lambda$ in accordance with equation (19) will insure that the pressure drop of cooling arrangement 1 matches that of cooling arrangement 2. However, it should be remembered that λ must in reality be chosen to produce an integral value for N in equation (1). In general, the fin pitch λ* obtained from equation (19) by Newton iteration will produce a value N* in equation (1) that is not an integer. Thus, the mathematical solution must be modified, considering instead the two integer values of N nearest the non-integer value N*, where, in accordance with equation (1), $$N^* \equiv \frac{H-f}{\lambda^*} + 1. \tag{20}$$

That is, in place of N*, we consider $$N_A \equiv \text{int}(N^*) \text{ and } N_B \equiv \text{int}(N^*)+1, \tag{21}$$

and thus, in accordance with equation (1), consider instead of λ* the following two values of fin pitch:

$$\lambda_A \equiv \frac{H-f}{N_A} \text{ and } \lambda_B \equiv \frac{H-f}{N_B}. \tag{22}$$

Corresponding to the two fin-pitch solutions $\lambda_A$ and $\lambda_B$, there are two solutions for $V_1$, $$V_{1A} = \frac{V}{N_A - 1}; \quad V_{1B} = \frac{V}{N_B - 1}; \tag{23}$$

two solutions for hydraulic diameter $d_1$, $$d_{1A} = \frac{2(W - 2b)(\lambda_A - f)}{(W - 2b) + (\lambda_A - f)}, \tag{24}$$

$$d_{1B} = \frac{2(W - 2b)(\lambda_B - f)}{(W - 2b) + (\lambda_B - f)};$$

two solutions for the cross-sectional area $A_1$ of a finned-heatsink channel, $$A_{1A} = (\lambda_A - f)(W - 2b), A_{1B} = (\lambda_B - f)(W - 2b); \tag{25}$$

two solutions for bulk velocity $U_1$, $$U_{1A} = \frac{V_{1A}}{A_{1A}}, \quad U_{1B} = \frac{V_{1B}}{A_{1B}}; \tag{26}$$

two solution for Reynolds number $Re_1$, $$Re_{1A} \equiv \frac{\rho U_{1A} d_{1A}}{\mu}, \quad Re_{1B} \equiv \frac{\rho U_{1B} d_{1B}}{\mu}; \tag{27}$$

two solutions for the fraction of open area $\theta_1$, $$\theta_{1A} = \frac{(N_A - 1)(\lambda_A - f)(W - 2b)}{WH}, \tag{28}$$

-continued
$$\theta_{1B} = \frac{(N_B - 1)(\lambda_B - f)(W - 2b)}{WH};$$

and thus two solutions for the pressure-drop components $\Delta p_{1,SKIN}$ and $\Delta p_{1,FORM}$, $$\Delta p_{1A,SKIN} = \left(\frac{1}{2}\rho U_{1A}^2\right)\left(\frac{L}{d_{1A}}\right)\left(\frac{64}{Re_{1A}}\right), \tag{29}$$

$$\Delta p_{1B,SKIN} = \left(\frac{1}{2}\rho U_{1B}^2\right)\left(\frac{L}{d_{1B}}\right)\left(\frac{64}{Re_{1B}}\right)$$

$$\Delta p_{1A,FORM} = \frac{1}{2}\rho U_0^2 \frac{(K - \theta_{1A})^2}{\theta_{1A}^2}; \tag{30}$$

$$\Delta p_{1B,FORM} = \frac{1}{2}\rho U_0^2 \frac{(K - \theta_{1B})^2}{\theta_{1B}^2}.$$

On the one hand, the "A" solution, which has a slightly larger fin pitch than that satisfying the equal-pressure-drop criterion (19), will cause pressure drop $\Delta p_{1A}$ to be somewhat less than $\Delta_{p2}$. On the other hand, the "B" solution, which has a slightly smaller fin pitch than that satisfying the equal-pressure-drop criterion (19), will cause pressure drop $\Delta p_{1B}$ to be somewhat greater than $\Delta p_2$. That is, $$\Delta p_{1A} < \Delta p_2 < \Delta p_{1B}. \tag{31}$$

In other words, the A and B solutions, having integral numbers of fins $N_A$ and $N_B = N_A + 1$ respectively, straddle the ideal, pressure-matched solution that can only be achieved by the non-physical, fractional number of fins N*.

Comparison of Thermal Performance Assuming Infinite Thermal Conductivity.

Let $R_i$ be the convective thermal resistance of one of the heatsinks in arrangement i (i=1, 2). For both cases, assume for the moment that the heatsinks are made of material with infinite thermal conductivity (this assumption will be eliminated later). Then, all heatsink surfaces are at the same temperature, so the convective thermal resistance of arrangement i is $$R_i = \frac{1}{h_i S_i}, \quad i = 1, 2, \tag{32}$$

where:

$S_i$=Total wetted surface area of the two heatsinks in arrangement i, (33)

$h_i$=Heat-transfer coefficient averaged over the wetted area $A_i$. (34)

Thermal performance of a heatsink is measured by its convective thermal resistance; lower thermal resistance is better because it leads to lower temperature of the heat-producing component that the heatsink cools. Therefore, a figure of merit β for the folded heatsink arrangement 2 vis-á-vis the finned heatsink arrangement 1 is $$\beta \equiv \frac{R_1}{R_2} = \left(\frac{h_2}{h_1}\right)\left(\frac{S_2}{S_1}\right) = \frac{\Delta T_1}{\Delta T_2}, \tag{35}$$

where the latter equality is true because the temperature rise $\Delta T_i$ from ambient air to heat-producing device for configuration i is essentially directly proportional to convective thermal resistance $R_i$.

If $\beta > 1$, then the folded heatsink arrangement 2 has better heat transfer (lower thermal resistance) than finned heatsink arrangement 1; if instead $\beta < 1$, then the opposite is true.

If flow in the heatsink channels is laminar, as previously assumed in connection with equation (15), the ratio of average heat transfer coefficients $h_i$ may be approximated as $$h_i = 1.86 \left( \frac{k_{FLUID}}{d_i} \right) \left( \frac{Re_i Pr}{L/d_i} \right)^{1/3}, \quad i = 1, 2. \tag{36}$$

where the Prantdl number Pr, a property of the cooling fluid, is, for example, 0.7 for air at room conditions. Therefore, the ratio of heat-transfer coefficients in equation (35) is given by $$\frac{h_2}{h_1} = \frac{\frac{Re_2^{1/3}}{d_2^{2/3}}}{\frac{Re_1^{1/3}}{d_1^{2/3}}} = \frac{\left( \frac{V_2}{A_2 d_2} \right)^{1/3}}{\left( \frac{V_1}{A_1 d_1} \right)^{1/3}} = \sqrt[3]{\frac{N-1}{3} \left( \frac{A_1 d_1}{A_2 d_2} \right)^{1/3}}, \tag{37}$$

where the second equality in equation (37) is obtained from equation (14), and the third equality in equation (37) is obtained from equations (7) and (8). Thus, substituting equation (37) into equation (35) yields $$\beta = \sqrt[3]{\frac{N-1}{3}} \left( \frac{A_1 d_1}{A_2 d_2} \right)^{1/3} \left( \frac{S_2}{S_1} \right). \tag{38}$$

By inspection of FIG. 11A, the wetted surface area S per unit streamwise length L of the two heatsinks in the conventional, finned-heatsink arrangement 1 is $$\frac{S_1}{L} = 2[H + N(W - 2b - c)]. \tag{39}$$

Similarly, by inspection of FIG. 11B, the wetted area per unit streamwise length L of the two heatsinks in the novel, folded-heatsink arrangement 2 is $$\frac{S_2}{L} = 2[3H + 4s - 2g]. \tag{40}$$

Note that, due to the two fin-pitch solutions $\lambda_A$ and $\lambda_B$, and the corresponding two integer values of N, namely $N_A$ and $N_B$, there are two corresponding values of $S_1$, denoted $S_{1A}$ and $S_{1B}$, and defined by $$\frac{S_{1A}}{L} = 2[H + N_A(W - 2b - c)], \tag{41}$$

$$\frac{S_{1B}}{L} = 2[H + N_B(W - 2b - c)]. \tag{42}$$

Thus, there are two solutions for the figure of merit $\beta$:

$$\beta_A = \sqrt[3]{\frac{N_A - 1}{3}} \left( \frac{A_{1A} d_{1A}}{A_2 d_2} \right)^{1/3} \left( \frac{S_2/L}{S_{1A}/L} \right), \tag{43}$$

$$\beta_B = \sqrt[3]{\frac{N_B - 1}{3}} \left( \frac{A_{1B} d_{1B}}{A_2 d_2} \right)^{1/3} \left( \frac{S_2/L}{S_{1B}/L} \right). \tag{44}$$

Comparison of Thermal Performance Assuming Finite Thermal Conductivity

The previous section assumed that the heatsinks in FIGS. 11A and 11B have infinite thermal conductivity, leading to equation (32). For conditions of interest to exemplary embodiments of the present invention, namely small W, this assumption is reasonable for the first finned heatsink 1136 and the second finned heatsink 1141 in the conventional finned-heatsink arrangement 1, because the heatsink fins 1138 are short enough that heatsinks made of copper, for example, are nearly isothermal. However, the assumption is not reasonable for the first folded heatsink 1144 or the second folded heatsink 1145 in exemplary embodiments of heatsink arrangement 2, because, for typical dimensions, the thermal path through the first folded heatsink 1144 from base 1146 to arms 1148 (and likewise the path through the second folded heatsink 1145 from base 1149 to arms 1151) is relatively long, so that even if the heatsinks 1144, 1145 are composed of copper, they are unlikely to be isothermal.

Consequently, for arrangement 2, let $$S_{21} = \text{Wetted area of two heatsinks' bases 1142, 1145,} \tag{45}$$

$$S_{22} = \text{Wetted area of two heatsinks' arms 1143, 1146 and legs 1144, 1147,} \tag{46}$$

where, by inspection of FIG. 11A, the wetted areas per unit streamwise length L are $$\frac{S_{21}}{L} = 2(H - 2t), \tag{47}$$

$$\frac{S_{22}}{L} = 2[2H + 4s + 2t - 2g]. \tag{48}$$

The convective thermal resistance $R_2$ may be viewed as two resistances in parallel; namely, a resistance $R_{21}$ associated with wetted area $S_{21}$, and a resistance $R_{22}$ associated with wetted area $S_{22}$. Each arm and adjoining shoulder is treated as a fin having a fin efficiency $\eta$, where $$R_{22} = \frac{1}{\eta h_2 S_{22}}. \tag{49}$$

Using the formula for parallel resistances, the total thermal resistance of the two heatsink in arrangement 2 may be written as $$\frac{1}{R_2} = \frac{1}{R_{21}} + \frac{1}{R_{22}} = h_2 S_{21} + \eta h_2 S_{22}. \tag{50}$$

Consequently, the figure of merit $\beta$ is given by the following equation, which replaces equation (35):

$$\beta \equiv \frac{R_1}{R_2} = \left(\frac{h_2}{h_1}\right)\left(\frac{S_{21} + \eta S_{22}}{S_1}\right). \quad (51)$$

Using equation (37) and the arguments that led to equations (43) and (44), the latter two equations are replaced, for the case of finite thermal conductivity, by $$\beta_A = \sqrt[3]{\frac{N_A - 1}{3}} \left(\frac{A_{1A} d_{1A}}{A_2 d_2}\right)^{1/3} \left(\frac{\frac{S_{21}}{L} + \eta \frac{S_{22}}{L}}{\frac{S_{1A}}{L}}\right), \quad (52)$$

$$\beta_B = \sqrt[3]{\frac{N_B - 1}{3}} \left(\frac{A_{1B} d_{1B}}{A_2 d_2}\right)^{1/3} \left(\frac{\frac{S_{21}}{L} + \eta \frac{S_{22}}{L}}{\frac{S_{1B}}{L}}\right). \quad (53)$$

To compute the "fin efficiency" $\eta$ associated with a shoulder 1147 and an adjoining arm 1148, (or shoulder 1150 and adjoining arm 1151), consider each arm and shoulder as a single, continuous fin having perimeter $$P \equiv 2(L+t), \quad (54)$$

a cross-sectional area $$A_{cross} = Lt, \quad (55)$$

and heat-flow path length $$l = s + \frac{H-g}{2}. \quad (56)$$

The well-known expression for fin efficiency $\eta$ is $$\eta = \frac{\tanh\psi}{\psi}; \quad \psi \equiv \sqrt{\frac{hP}{k_{FIN} A_{cross}}} l. \quad (57)$$

Substituting equations (54), (55), and (56) into (57), and noting that the relevant value of h is $h_2$, yields $$\psi = \sqrt{\frac{2h_2\left(1 + \frac{t}{L}\right)}{k_{FIN} t}} \left(s + \frac{H-g}{2}\right). \quad (58)$$

Substituting equation (36) into equation (58) yields $$\psi = \sqrt{\left(\frac{3.72}{d_2 t}\right)\left(1 + \frac{t}{L}\right)\left(\frac{k_{FLUID}}{k_{FIN}}\right)\left(\frac{Re_2 Pr}{L/d_2}\right)^{1/3}} \left(s + \frac{H-g}{2}\right). \quad (59)$$

Substituting equations (14) and (8) into equation (59) yields:

$$\psi = \sqrt{\left(\frac{2.80}{d_2 t}\right)\left(1 + \frac{t}{L}\right)\left(\frac{k_{FULID}}{k_{FIN}}\right)\left(\frac{\rho V Pr}{\mu L}\right)^{1/3}} \left(s + \frac{H-g}{2}\right). \quad (60)$$

Noting that $$\frac{\rho Pr}{\mu} = \frac{1}{\alpha},$$

where $\alpha$ is thermal diffusivity of the fluid, yields:

$$\psi = \sqrt{\left(\frac{2.80}{d_2 t}\right)\left(1 + \frac{t}{L}\right)\left(\frac{k_{FULID}}{k_{FIN}}\right)\left(\frac{V}{\alpha L}\right)^{1/3}} \left(s + \frac{H-g}{2}\right). \quad (61)$$

Substitution of (61) into (57), and then (57) into (52) and (53) yields the complete solution for the figures of merit $\beta_A$ and $\beta_B$ in terms of known quantities.

Summary of Numerical Algorithm (Finite Thermal Conductivity)

The following is a summary of the numerical algorithm that implements the above solution:

Step 0. Select fluid, which implies fluid properties $\rho$, $\mu$, Pr, and $\alpha$.

Step 1. Select values for dimensions H, f, W, b, t, c, g, and L as well as for $U_0$.

Step 2. Compute $$s = \frac{W - 4t}{3}$$

as given by equation (2).

Step 3. Find $\lambda^*$ by applying Newton iteration to equation (19).

Step 4. Compute $N^*$ from equation (20); compute $N_A$ and $N_B$ from equation (21).

Step 5. Compute fin pitches $\lambda_A$ and $\lambda_B$ from equation (22).

Step 6. Compute hydraulic diameters $d_2$, $d_{1A}$, $d_{1B}$ from equations (10) and (24).

Step 7. Compute cross-sectional areas $A_2$, $A_{1A}$, $A_{1B}$ from equations (13) and (25).

Step 8. Compute wetted-areas-per-unit-length $S_2/L$, $S_{1A}/L$, $S_{1B}/L$ from equations (40) and (41), (42).

Step 9. Compute $\psi$ from equation (60).

Step 10. Compute fin efficiency $\eta$ for arrangement 2 using equation (57).

Step 11. Compute figures of merit $\beta_A$ and $\beta_B$ from equations (52) and (53), using the values of $N_A$, $N_B$ computed in Step 4, the values of hydraulic diameters computed in Step 6, the values of cross-sectional areas computed in Step 7, and values of wetted-areas-per-unit-length computed in Step 8, and the value of fin efficiency $\eta$ computed in Step 10.

Example Results of Mathematical Analysis

Figure 12:
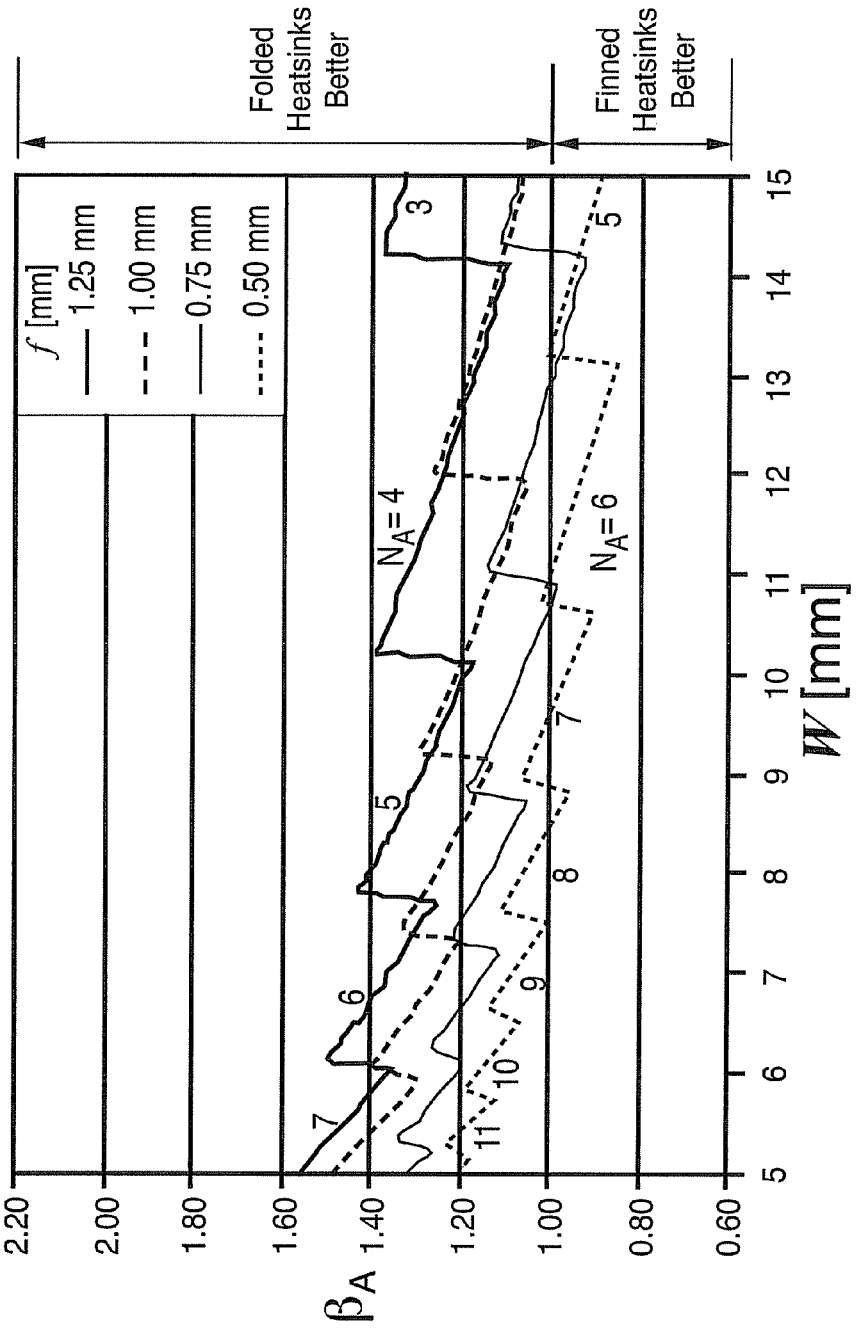
FIGS. 12-17 are charts that compare the effectiveness of an exemplary finned heatsink and an exemplary folded heatsink.
Figure 13:
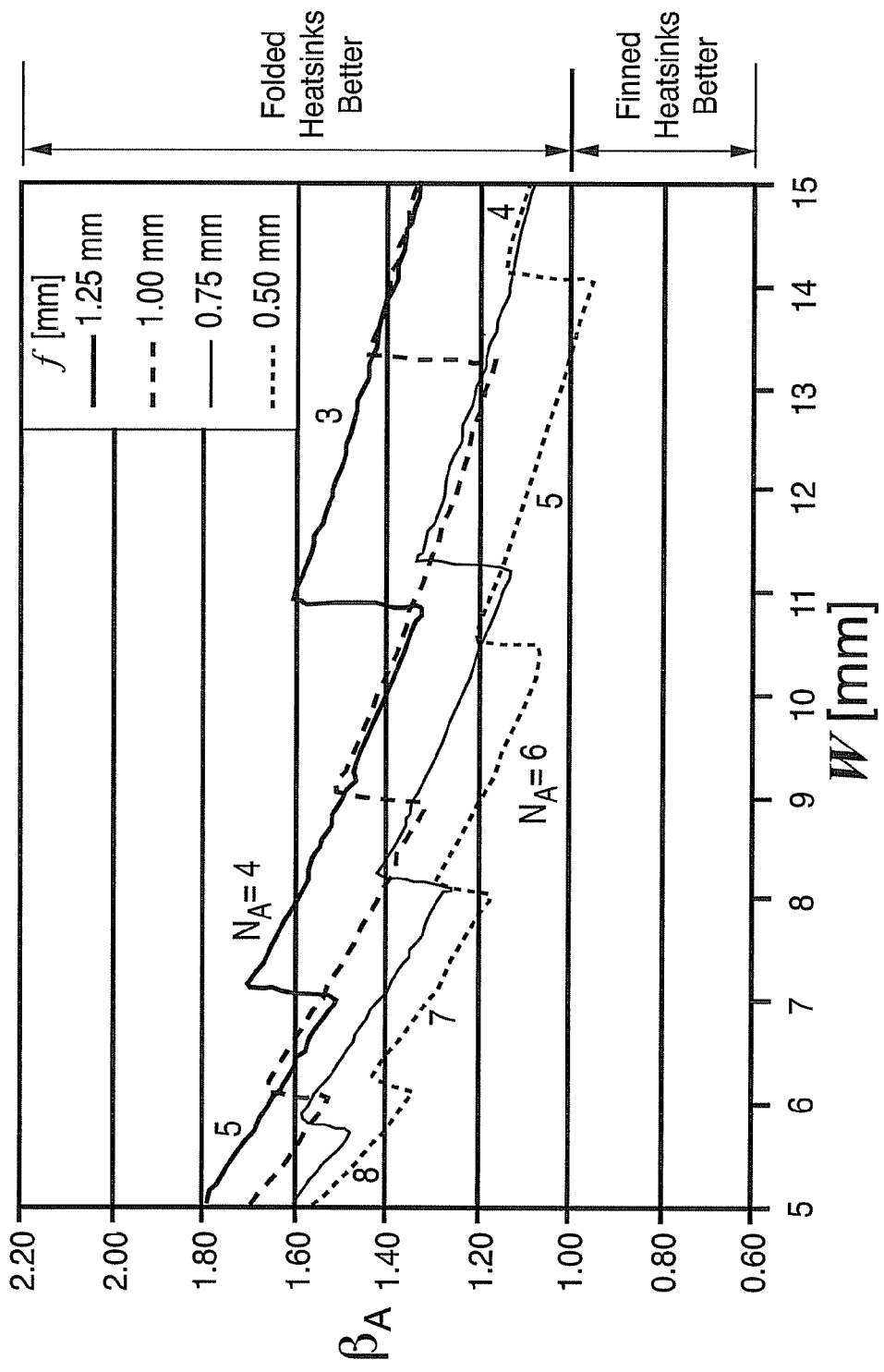
Figure 14:
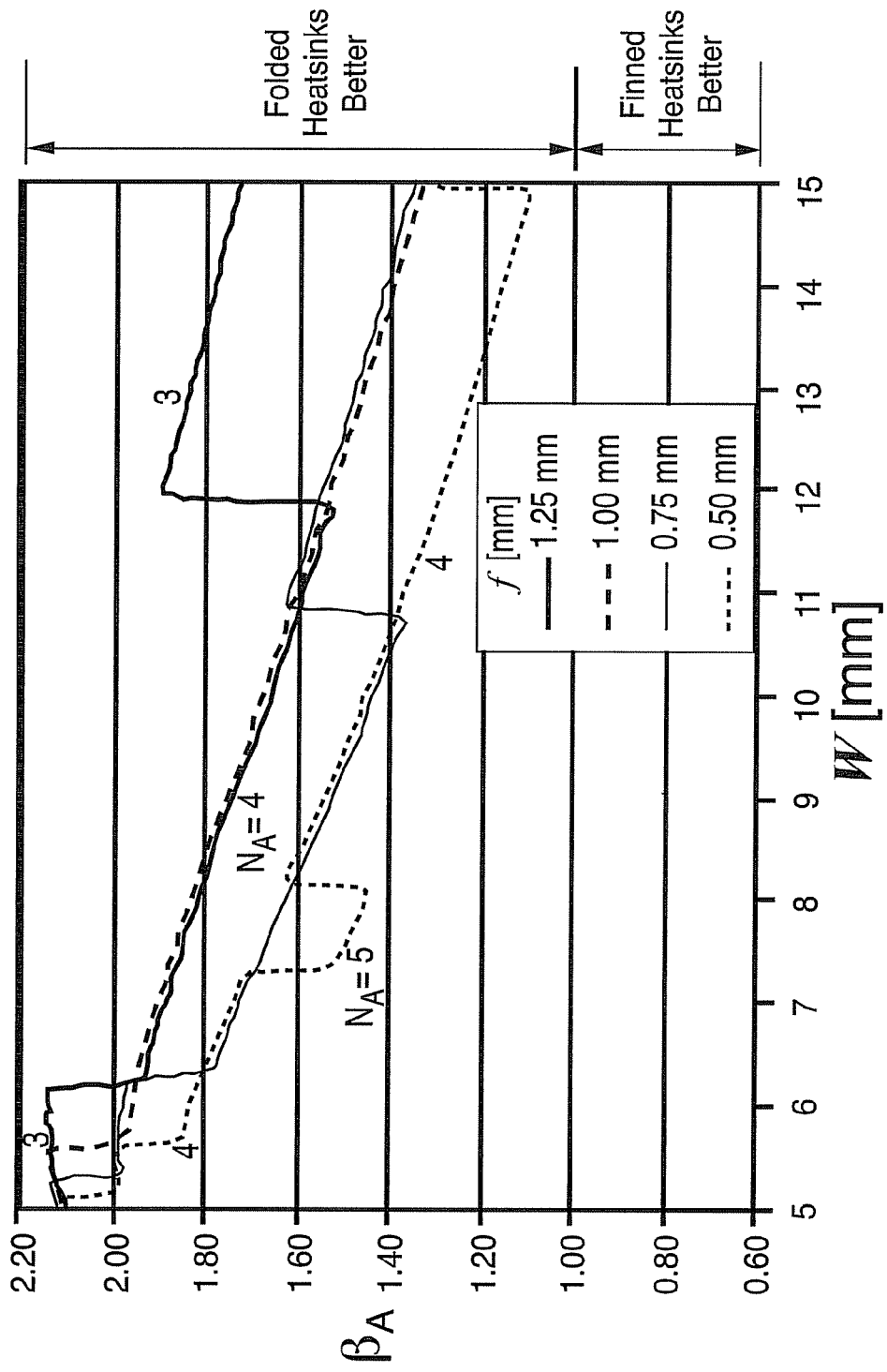

As an example of the foregoing mathematical analysis that illustrates the advantage of exemplary embodiments of the present invention that utilize a folded heatsink, consider the following values of the various parameters that appear in the above equations. These values were chosen because they are relevant to air cooling of typical DIMM cards:

Fluid Properties:
Thermal diffusivity of air: a=2.25×10$^{-5}$[m$^2$/s]
Thermal conductivity of cooling fluid (air): k$_{FLUID}$=0.026 [W/mK]
Thermal conductivity of fin (copper): k$_{FIN}$=380 [W/mK]
Viscosity (air): μ=18.46×10$^{-6}$ [Pa-s]
Density (air): ρ=1.16 [kg/m$^3$]
Parameters for Both Finned and Folded Heatsinks:
Approach Velocity: U$_0$=2.5 [m/s]
Total Height: H=38.0 [mm]
Total width W: Used as abscissa on FIGS. 8-13; 5.0 mm≦W≦15.0 mm
Heatsink Streamwise Length: L=100 [mm]
Thickness of circuit card: w$_{CARD}$=1.27 [mm]
Thickness of DRAM: w$_{DRAM}$=1.0 [mm]
Form-drag constant in equation (16): K=1.25 [--]
Parameters for Finned Heatsinks:
Fin Thickness f: On each of the plots shown as FIGS. 12-17, curves are given for f=0.50, 0.75, 1.00, and 1.25 mm.
Base Thickness b: For FIGS. 12 and 15, b=,75 mm; for FIGS. 13 and 16, b=1.00 mm; and for FIGS. 14 and 17, b=1.25 mm.
Fin clearance: c=1.0 [mm]
Parameters for Folded Heatsinks:
Sheet-metal thickness: t=0.3 mm
Folded-heatsink gap: g=2.0 mm FIGS. 12-14 show, as given by equation (52), the figure of merit β$_A$ for an exemplary embodiment of the present invention such as the folded-heatsink cooling arrangement 922 when compared to the conventional finned-heatsink cooling arrangement 816, where each heatsink of the latter arrangement has N$_A$≡int(N*) fins, such that the pressure drop through the first finned heatsink 1136 and the second finned heatsink 1141 is slightly less than that through the first folded heatsink 1144 and the second folded heatsink 1145. Thus, the comparison represented by β$_A$ gives the folded heatsinks a slight advantage.

Figure 15:
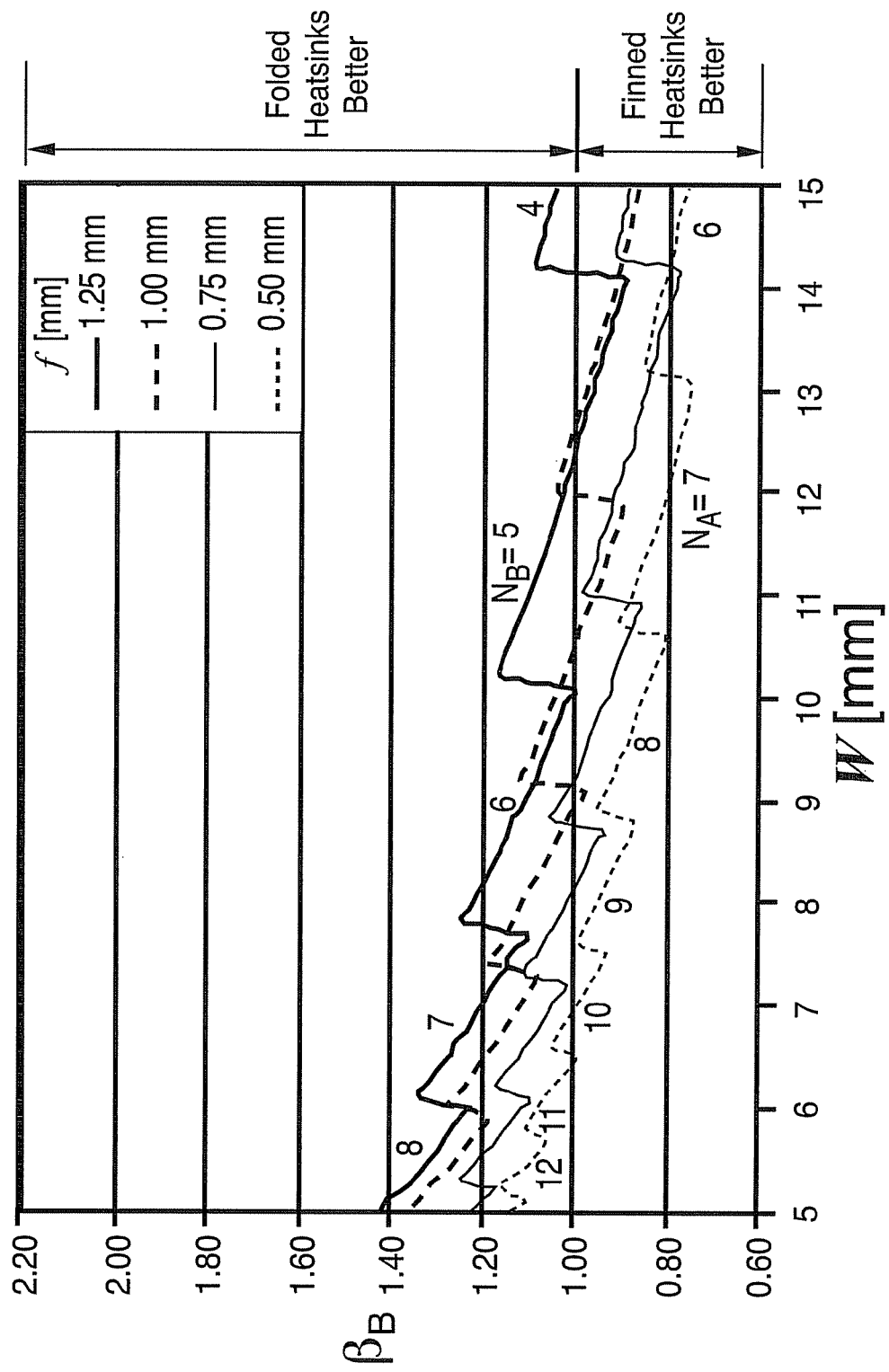
Figure 16:
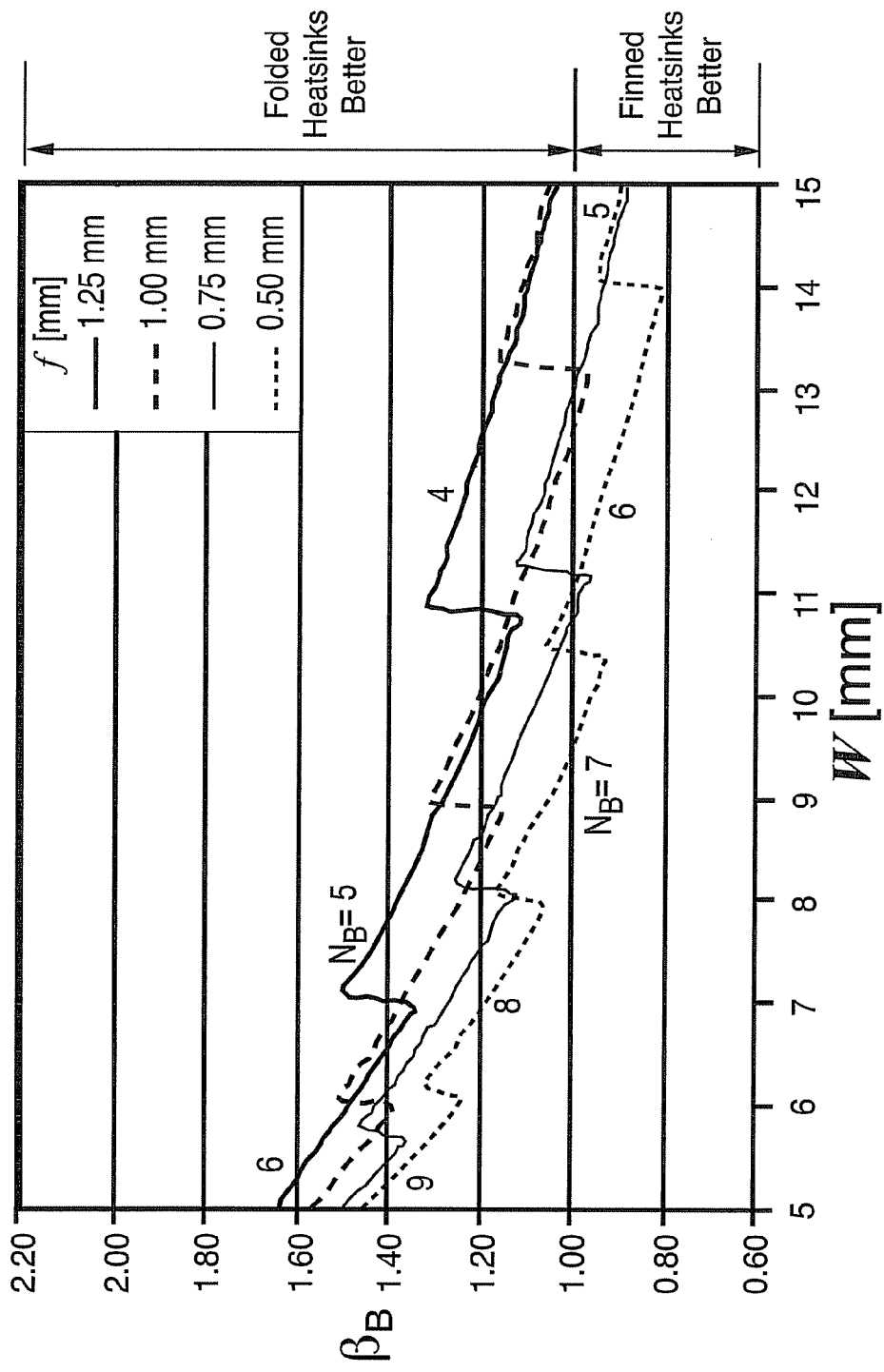
Figure 17:
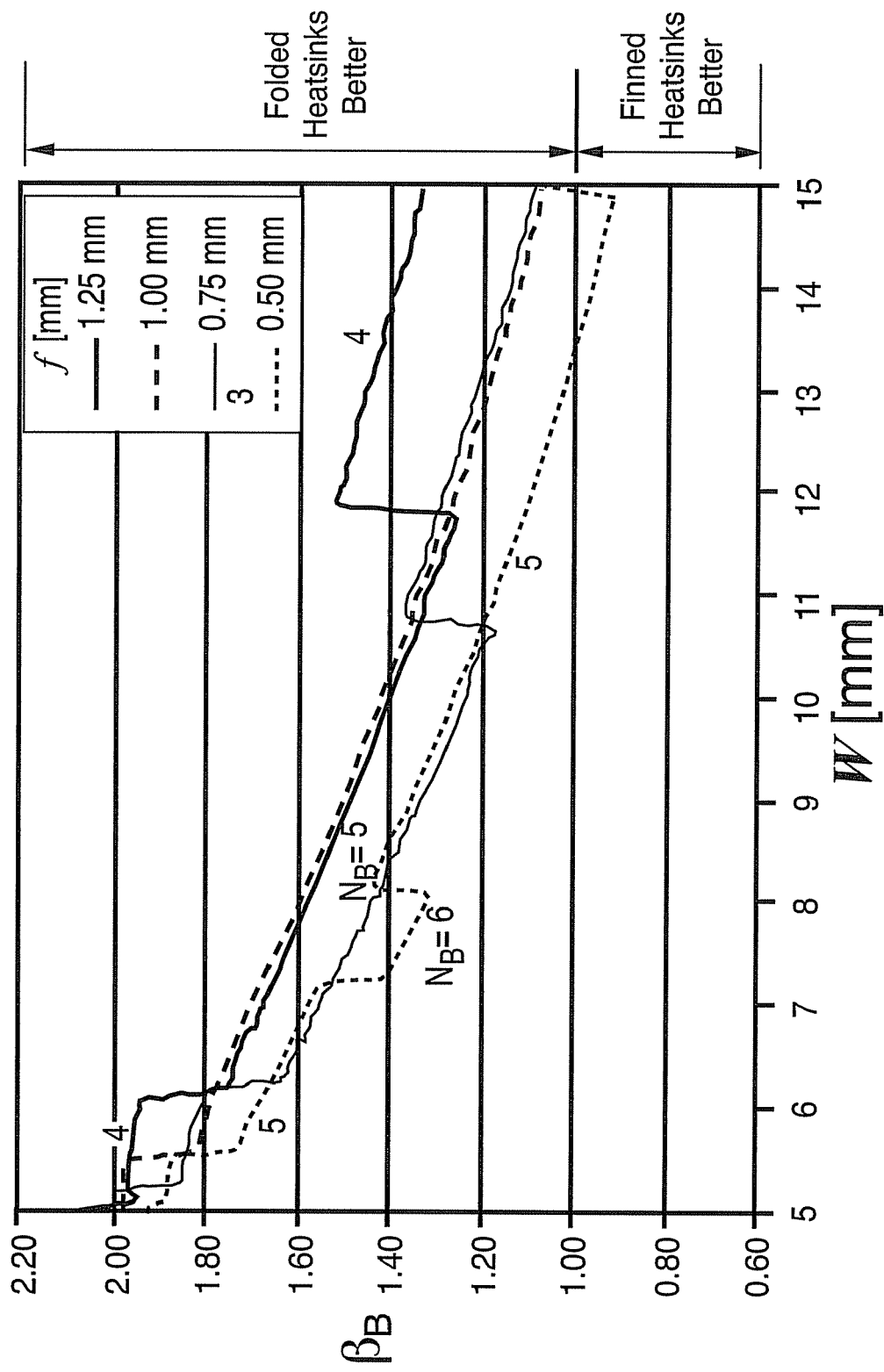

FIGS. 15-17 show, as given by equation (53), the figure of merit β$_B$, where each finned heatsink in finned-heatsink cooling arrangement 816 has N$_B$≡int(N*)+1 fins, such that the pressure drop through the first finned heatsink 1136 and the second finned heatsink 1141 is just slightly greater than that through the first folded heatsink 1144 and the second folded heatsink 1145. Thus, the comparison represented by β$_B$ gives the finned heatsinks a slight advantage.

To interpret FIGS. 12-17, recall equation (35), which says that the temperature rise ΔT$_1$ of the heat-producing devices cooled by the finned heatsinks in FIG. 11A will be β times as large as the temperature rise ΔT$_2$ of the same devices cooled by the folded heatsinks in FIG. 11B. Consequently, whenever one of the figures of merit, β$_A$ or β$_B$, is greater than 1, exemplary embodiments of the folded-heatsink cooling arrangement 922 will provide better cooling (lower device temperature) than the finned-heatsink cooling arrangement 816. Thus, FIGS. 12-17 demonstrate that the folded heatsinks of the present invention are superior for most of the parameter space covered thereby, inasmuch as β$_A$ and β$_B$ are greater than 1 for most values of the abscissa W and the parameters b and t. In particular, when the total width W available for the heatsinks is small, the folded heatsinks of the present invention are particularly advantageous, an advantage that becomes more and more pronounced as b and f increase, because large b and f rob surface area from the finned-heat-sink arrangement. In a limiting case defined by W→2b+c, the height (x dimension) of the fins 1138 in FIG. 11A, ½[W−(2b+c)], approaches zero. In this case, the folded heatsink arrangement 2 (FIG. 11B) has roughly three times the wetted area of the finned heatsink arrangement, so clearly the folded heatsink arrangement provides better cooling.

FIGS. 12-17 demonstrate that the figures of merit β$_A$, β$_B$ are not only strong functions of W, but are also strong functions of the assumed finned-heatsink base thickness b and fin thickness f. In fact, with the set of parameters used for FIGS. 12-17, a value of base thickness somewhat greater than b=1.25 mm does not even admit a mathematical solution for β$_A$, β$_B$ using most values of W shown, because the equal-pressure-drop criterion (19) cannot be met. In such cases, the finned heatsinks cannot, even for infinite fin pitch λ (that is, even with N=0 fins), achieve a pressure drop as low as the folded heatsinks, because the base of the finned heatsink itself already blocks too much area, even without any fins. Exemplary embodiments of the present invention take advantage of the ready availability of thin sheet metal for use in the folded heatsinks (t=0.3 mm was used in the numerical examples) versus the unavailability of finned heatsinks with very thin bases and fins. In fact, although the smallest value of f adopted in the examples, f=0.5 mm, accurately reflects the current state of the finned-heatsink art, the smallest value of b adopted therein (b=0.75 mm) is smaller than what is currently possible in the art, and even the largest value of b adopted (b=1.25 mm) is very difficult to achieve by low-cost means such as extrusion. Regardless of manufacturing limitations, however, it is also the intrinsic shape of the folded heatsink that makes it superior to the finned heatsink when W is small.

The range of width W shown in FIGS. 12-17 is reasonable for application to DIMM cards for the following reasons. W is related to DIMM-card pitch Ψ by equation (5), wherein typical values are w$_{CARD}$=1.27 mm and w$_{DRAM}$=1.0 mm. State-of-the-art DIMM packaging demands Ψ=10 mm or less, therefore W=6.73 mm or less, which is near the right-hand side of FIGS. 14-17, where the folded heatsinks are most advantageous.

The discontinuous nature of the curves shown on FIGS. 12-17 is a consequence of the necessary constraint of N$_A$ to integer values, as previously explained in connection with equation (20). To quantify this in FIGS. 12-14, the numbers of fins N$_A$ specified by the mathematical solution is written on various segments of the two curves for f=0.50 mm and f=1.25 mm. Similarly, in FIGS. 15-17, the number of fins N$_B$=N$_A$+1 is written on the analogous two curves.

In FIGS. 14 and 17, the curves have a peculiar shape. For example, in FIG. 14 for f=0.50, the curve dips discontinuously down and then back up again, corresponding to a change from 4 fins (5.6≦W≦7.2) to 5 fins (7.3≦W≦8.1) and then back to 4 fins (8.2≦W≦15.0). The reason for this can be understood by plotting, for the parameters relevant to FIGS. 14 and 17, Δp$_1$ versus W for various values of N$_A$, and overlaying on this plot the analogous curve for Δp$_2$ versus W. The latter curve is more concave than the former curves, and so, as W increases, the Δp$_2$ curve crosses the Δp$_1$ curves first in one direction and then the other. Because the mathematical solution chooses the number of fins N$_A$ to satisfy equation (31), this criss-crossing behavior naturally produces the seemingly peculiar result seen in FIGS. 14 and 17.

Other Variations of Folded Heatsinks

Figure 18:
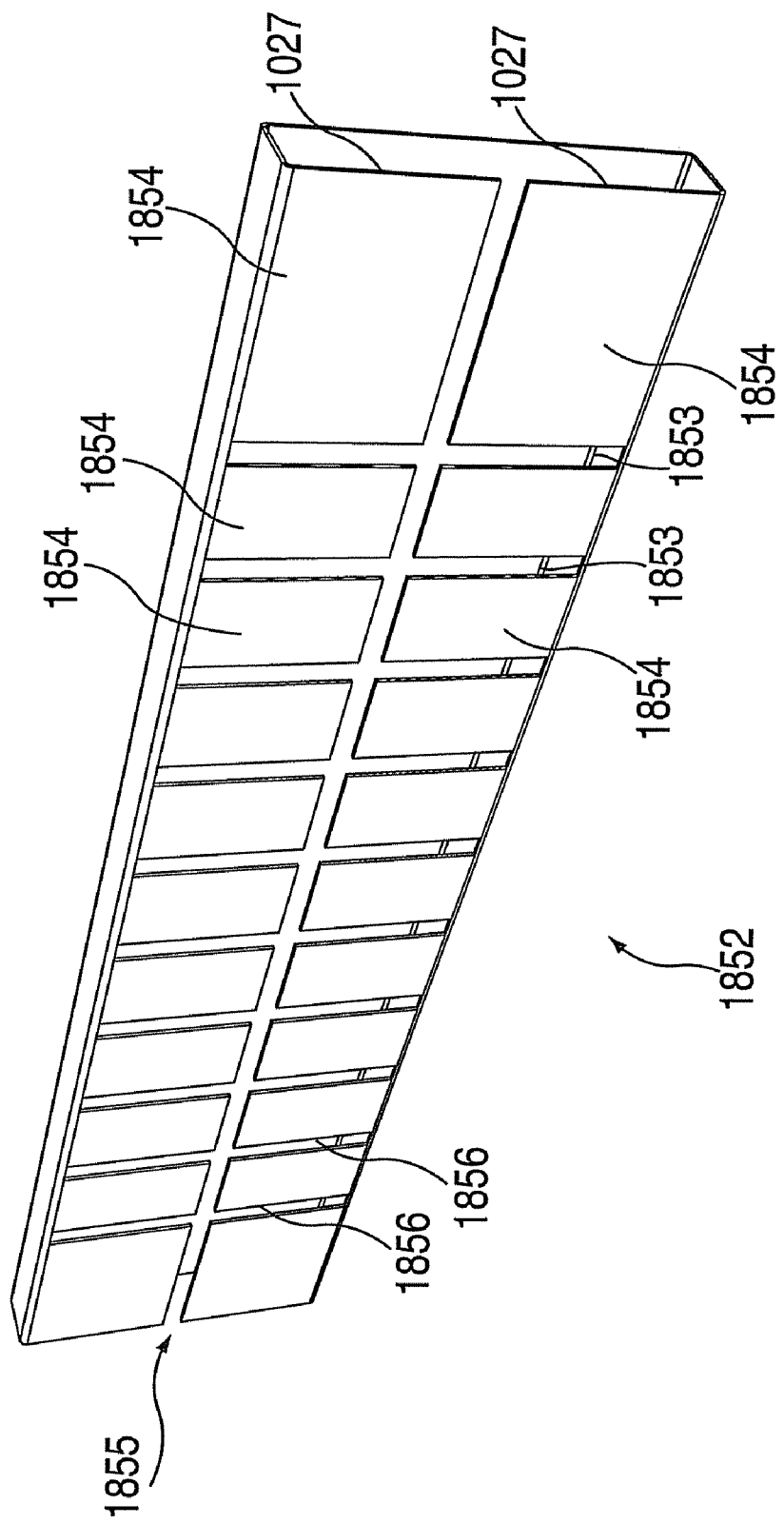
FIG. 18 depicts a folded heatsink that may be implemented by exemplary embodiments.

FIG. 18 shows a variation of an exemplary folded heatsink 1852 in which each of its arms 1027 is made up of a series of alternating slits 1853 and tabs 1854. A similar technique may be applied to other folded heatsinks described herein. Each tab 1854 is preferably centered above the DRAM that it locally cools. The narrow slits 1853 reduce only slightly the total wetted surface area of the arms 1027, but may achieve better convective heat transfer on the remaining surface of the tabs 1854, because the boundary layer of air 1855 that flows over the arms 1027 is restarted at the leading edge 1856 of each tab 1854, leading potentially to a higher heat-transfer coefficient than in the absence of slits, albeit at the expense of a slightly higher pressure drop.

FIGS. 19A, 19B and 19C show a variation of an exemplary folded heatsink arrangement 1957 in which the front folded heatsink 923 and the rear folded heatsink 924 in the folded-heatsink cooling arrangement 922 are replaced by segmented heatsinks that cool various smaller subsets of the heat-producing devices on the DIMM circuit card 503. Specifically, the front folded heatsink 923 is replaced by two front DRAM folded heatsinks 1958 and one hub-chip folded heatsink 1959. Similarly, the rear folded heatsink 924 is replaced by two rear DRAM folded heatsinks 1960. On the front side of the DIMM circuit card 503, the advantage of this segmented-heatsink construction is twofold: first, the hub chip 507 can be separately accessed in the event of failures, without disturbing the heatsinks on the DRAMs. Second, the front DRAM folded heatsinks 1958 and the hub chip folded heatsink 1959 on the front are simpler to construct than the front folded heatsink 923 because the small heatsinks do not contain the non-coplanar DRAM segment 1032 and hub chips segment 1033 (FIG. 10B) to accommodate potentially different thicknesses of DRAMs and hub devices. On the rear side of the DIMM card, the advantage of having two-smaller rear DRAM folded heatsinks 1960 relative to a single piece rear folded heatsink 924 is that, at the expense of less heat-convecting area, the smaller-rear DRAM folded heatsink 1960 expose the rear of the hub chip 507, thereby permitting electrical probing of it via contacts during module and/or system test, as well as for diagnostic testing of failures, if required.

Figure 19:
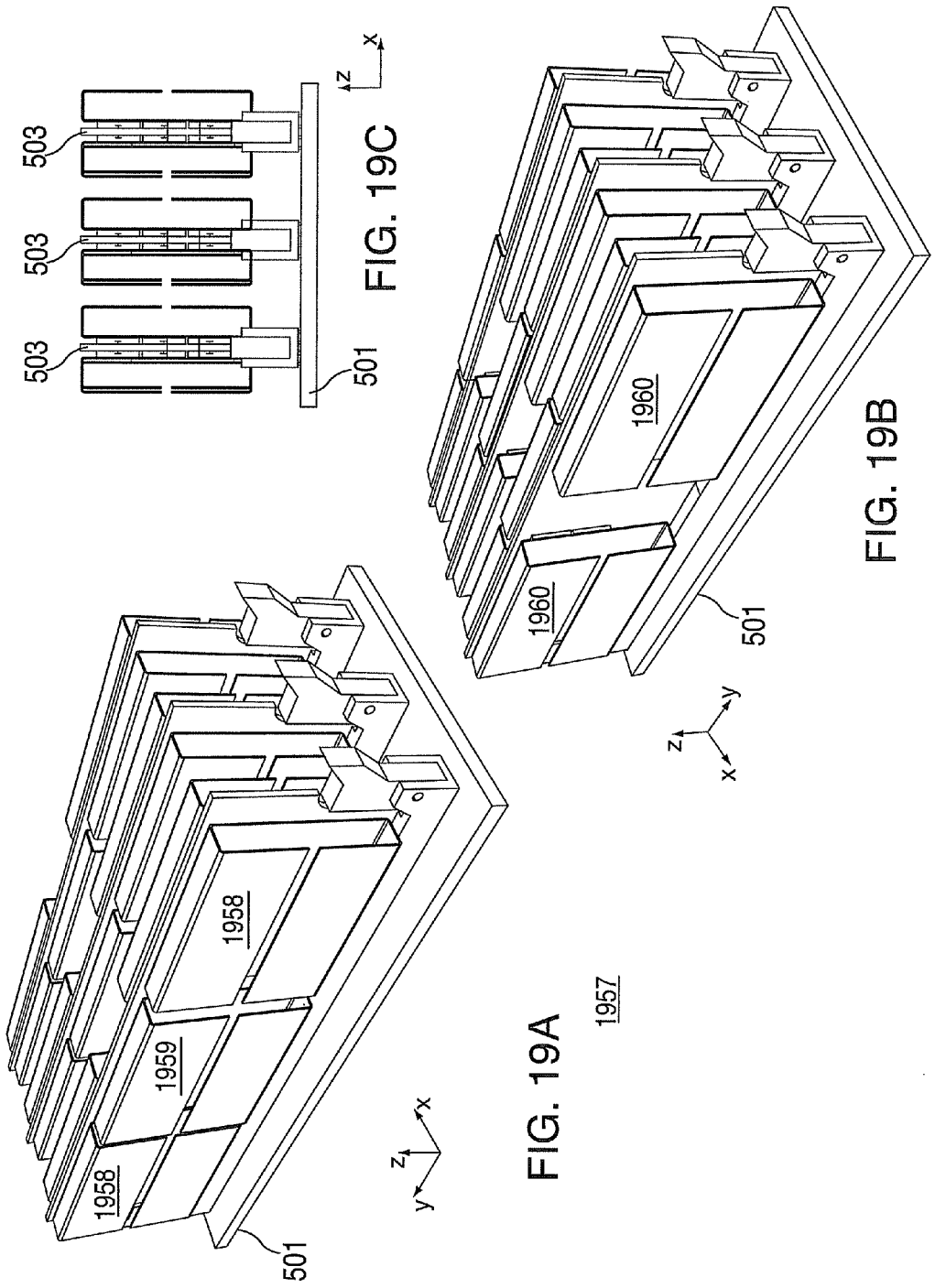
FIGS. 19A, 19B and 19C depict a folded heatsink cooling arrangement that may be implemented by exemplary embodiments.
Figure 20:
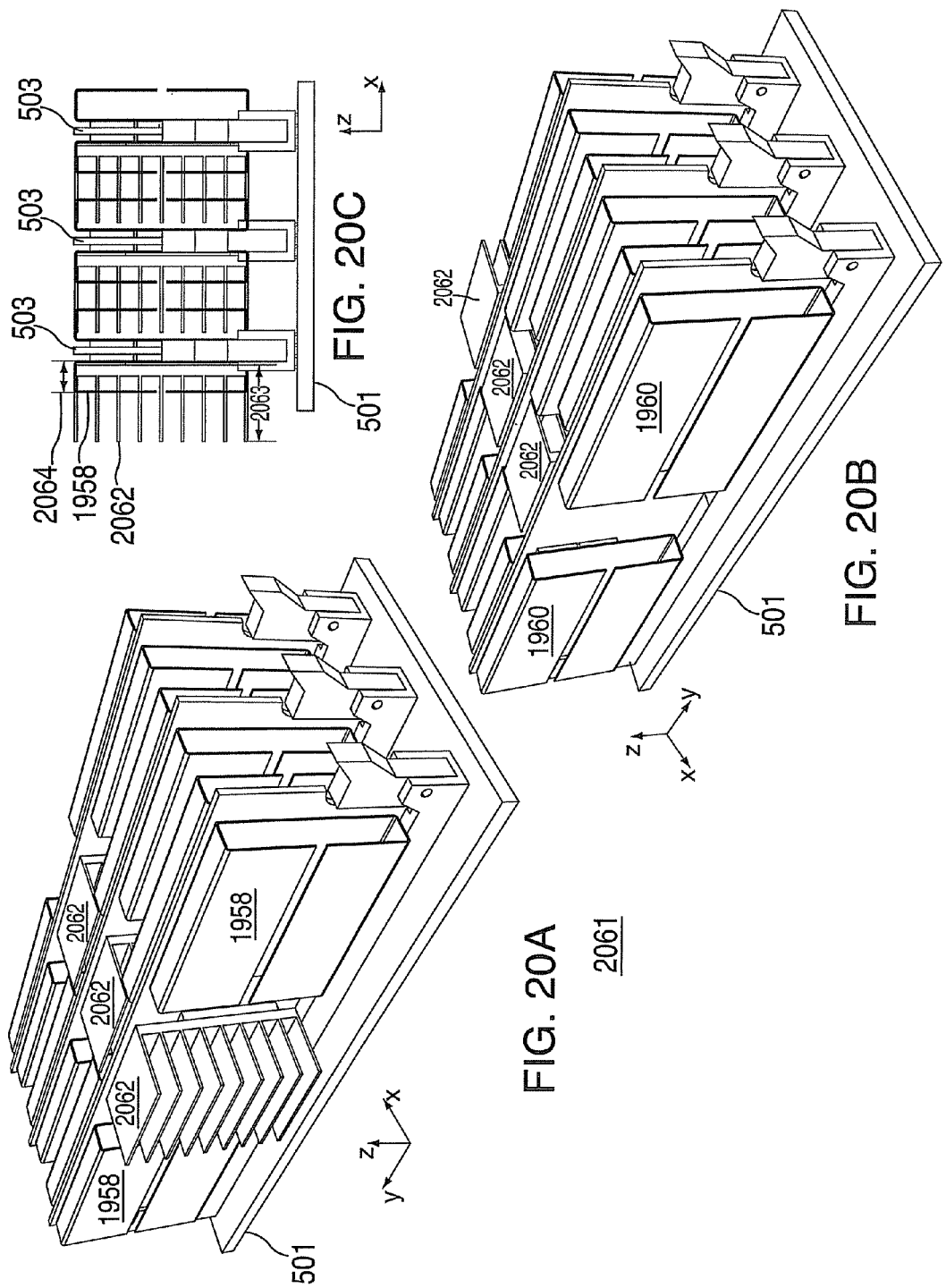
FIGS. 20A, 20B and 20C depict a heatsink cooling arrangement that includes finned and folded heatsinks.

FIGS. 20A, 20B and 20C show a variation of the exemplary folded heatsink arrangement 1957 depicted in FIG. 19. In the mixed cooling arrangement 2061 depicted in FIG. 20, the hub chip folded heatsink 1959 is replaced by a small finned hub chip heatsink 2062. This mixed use of folded and finned heatsinks may be appropriate when the x-dimension 2063 (shown in FIG. 20C) that is available for a hub heatsink is large enough so that the finned hub chip heatsink 2062 outperforms an equivalently sized folded heatsink, whereas the smaller x-dimension 2064 available for the DRAM heatsink is such that the front DRAM folded heatsinks 1958 outperform an equivalently sized finned heatsink. An exemplary embodiment includes the use of stacked memory devices, often resulting in increased component height when compared to planar memory devices, in conjunction with one or more hub devices.

Figure 21:
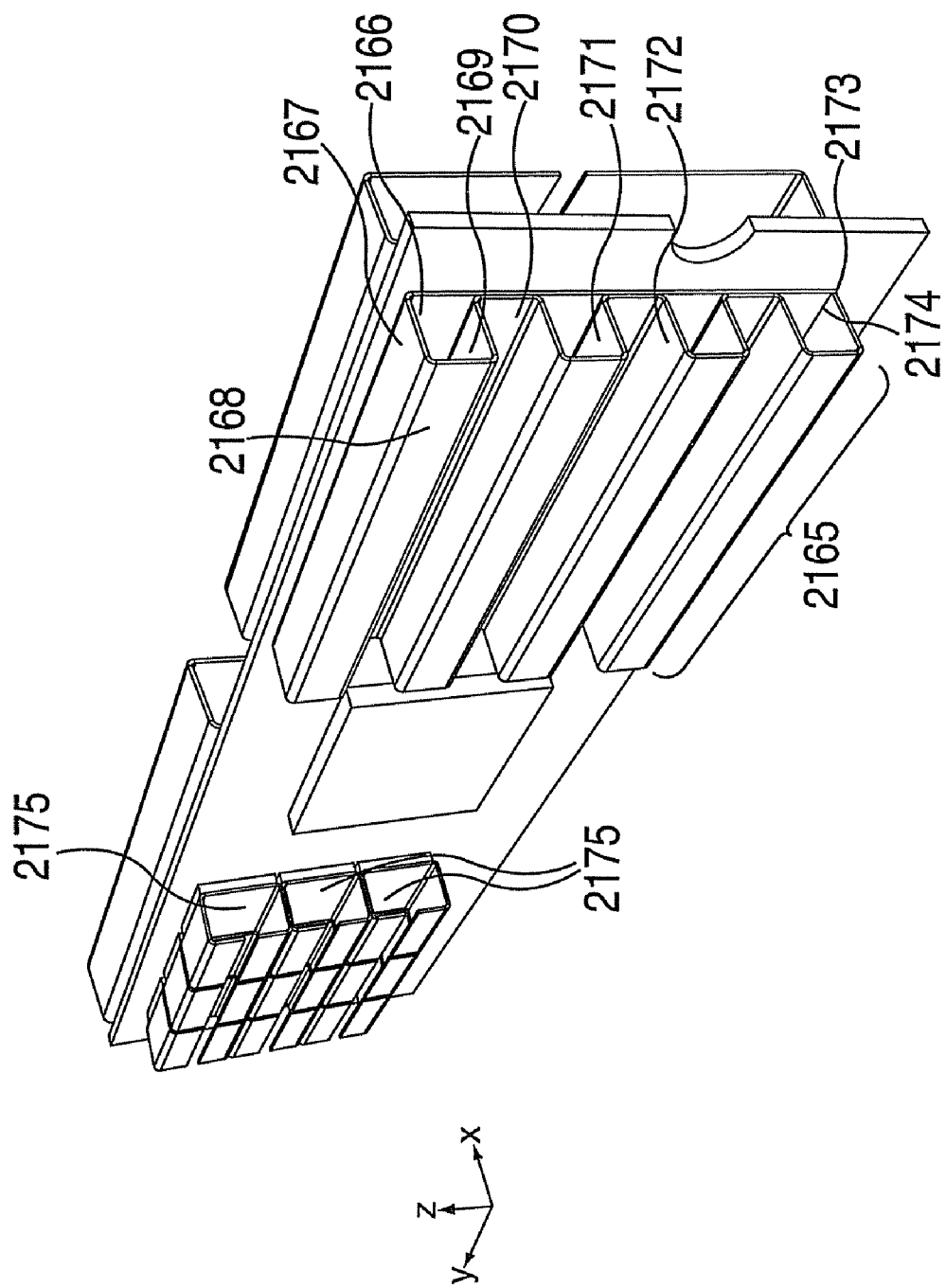
FIG. 21 depicts folded heatsinks that may be implemented by exemplary embodiments.

FIG. 21 shows two variations of the folded heatsinks, such as those depicted in FIG. 9, that may be implemented by exemplary embodiments of the present invention. In a first variation, a corrugated heatsink 2165 is made from a single piece of folded sheet metal, comprising a base 2166 plus a plurality of corrugations, each corrugation comprising a riser 2167, a roof 2168, a descender 2169, and (except for the negative-z-most corrugation) a foot 2170. Each foot 2170 is in contact with the base 2166 to insure good thermal contact therebetween. Consequently, the corrugations form a number n of closed airflow channels 2171, each bounded by the base 2166, one of the risers 2167, one of the roofs 2168, and one of the descenders 2169. The corrugations also form n−1 open airflow channels 2172, each bounded on three sides by the base 2166, one of the risers 2167, and one of the descenders 2169. The order of sheet-metal folding is clarified by noting that the sheet metal has a first end 2173 at the −y edge of the base 2166, and a second end at the +x edge of the −z-most descender 2169, such that the two ends of the sheet metal meet at a corner 2174. Exemplary embodiments of the corrugated heatsink 2165 provide convecting surfaces (e.g., base 2166, risers 2167, roofs 2168 and descenders 2169) with shorter thermal path lengths connecting them to the source of heat (i.e. the DRAM) than do the arms 1027 of a folded heatsink such as the front folded heatsink 923 or the rear folded heatsink 924, so the effective fin efficiency η of corrugated heatsink 2165 is higher than that of folded heatsinks 923 and 924. In addition, corrugated heatsink 2165 provides simplified attachment by virtue of the open channels 2172, which may be used to accommodate a tool for applying force to achieve good adhesive contact between heatsink and the heat-producing device. Further, the corrugated heatsink 2165 is more rugged than folded heatsinks 923 and 924 that have cantilevered folds of sheet metal, which may be inadvertently bent.

The exemplary embodiment of FIG. 21 includes a folded heatsink, such as the corrugated heatsink 2165 for cooling heat-producing devices. The corrugated heatsink 2165 includes a base 2166 being substantially planar for affixing in thermal contact to an exposed substantially planar surface of a heat-producing device. The corrugated heatsink 2165 also includes a plurality of corrugations in contact with the base 2165 for forming closed airflow channels. Each of the corrugations includes a riser 2167, a roof 2168, a descender 2169 and a foot 2170. The riser 2167 has a proximal end and a distal end. The proximal end of the riser 2167 projects substantially at a right angle from the base 2166. The roof 2168 has a proximal end and a distal end with the proximal end of the roof 2168 projecting substantially at a right angle from the distal end of the riser 2167. The descender 2169 has a proximal end and a distal end with the proximal end of the descender 2169 projecting substantially at a right angle from the distal end of the roof 2168, and extending toward the base 2166. The foot 2170, which is parallel to the base 2165 and in contact with it, has a proximal end and a distal end, with the proximal end of the foot 2170 projecting substantially at a right angle from the distal end of the descender 2169. The distal end of the foot 2170 is in contact with proximal end of the next riser 2167. The corrugated heatsink 2165 is formed from a continuous sheet of metal.

FIG. 21 also shows a second folded-heatsink variation that may be implemented by exemplary embodiments of the present invention: a plurality of small DRAM heatsinks 2175 that cover a like number of DRAMs such that each heatsink covers just one DRAM. Each small DRAM heatsink 2175 is a miniature version of the front DRAM folded heatsink 1958. An array of nine such small DRAM heatsink 2175 is shown. These small DRAM heatsinks 2175 are advantageous when compared to the front DRAM folded heatsink 1958 if the several DRAM's do not have co-planar top surfaces, because then the adhesive layer between the front DRAM folded heatsink 1958 and the several DRAMs cannot be as thin as desirable in every location to minimize conductive thermal resistance. In contrast, each small DRAM heatsink 2175 that covers a single DRAM can accommodate itself to the DRAM it covers, and thereby achieve a thin layer of adhesive having minimal conductive thermal resistance. A disadvantage of the small DRAM heatsinks 2175 is that there are more of them to assemble, which incurs higher manufacturing cost.

Figure 22:
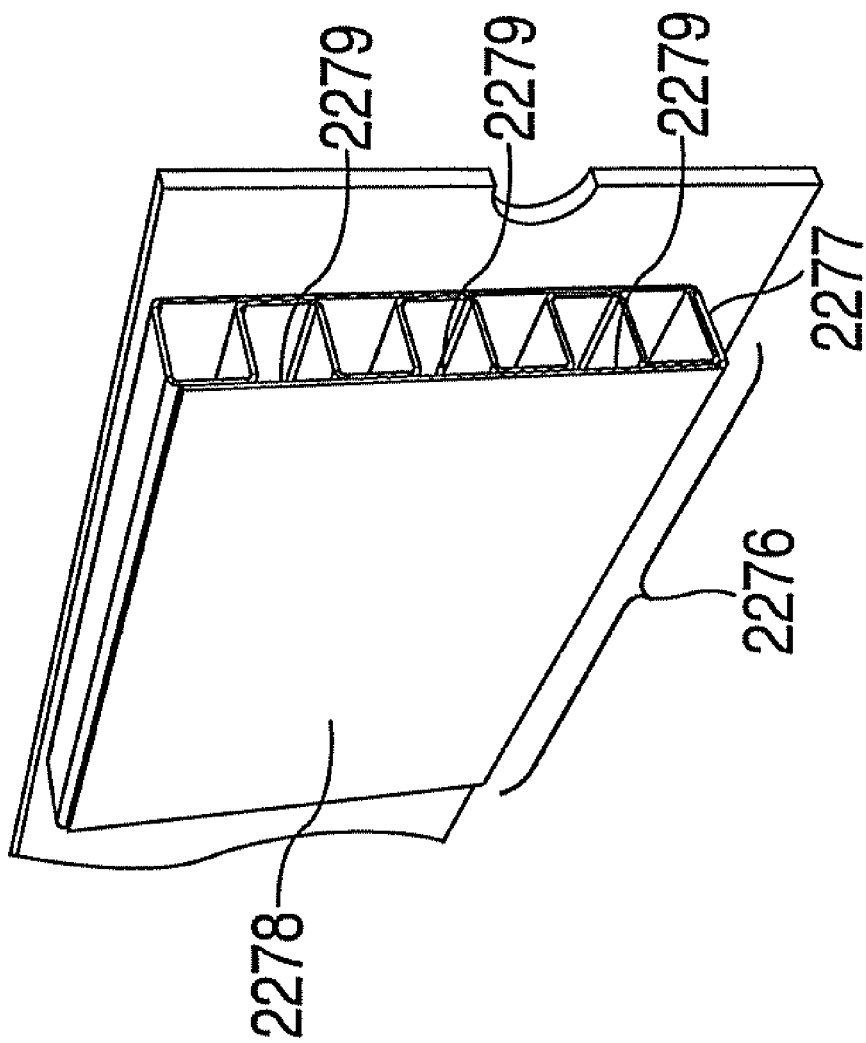
FIG. 22 depicts a folded heatsink that may be implemented by exemplary embodiments.

FIG. 22 shows a third folded-heatsink variation that may be implemented by exemplary embodiments of the present invention: a corrugated capped heatsink 2276 that is similar to the corrugated heatsink 2165, except that the sheet metal in heatsink 2276 does not terminate at edge 2173; rather the sheet metal continues in a fold toward the −x direction, thereby forming an additional riser, or ascender 2277, and further continues in a fold toward the +z direction to form a cap 2278 that lies parallel to the base 2166, and extends the full z dimension of the capped heatsink 2276. The cap 2278 is in contact with each roof 2168 to insure good thermal contact there between. The capped heatsink 2276 is advantageous when compared to the uncapped corrugated heatsink 2165 because the cap 2278 provides additional wetted area 2279 where it closes the otherwise unclosed channels, and hence it provides lower convective thermal resistance. However, in some applications, the capped heatsink 2276 may be disadvantageous when compared to the corrugated heatsink 2165 because it may have too high of a pressure drop.

Figure 23:
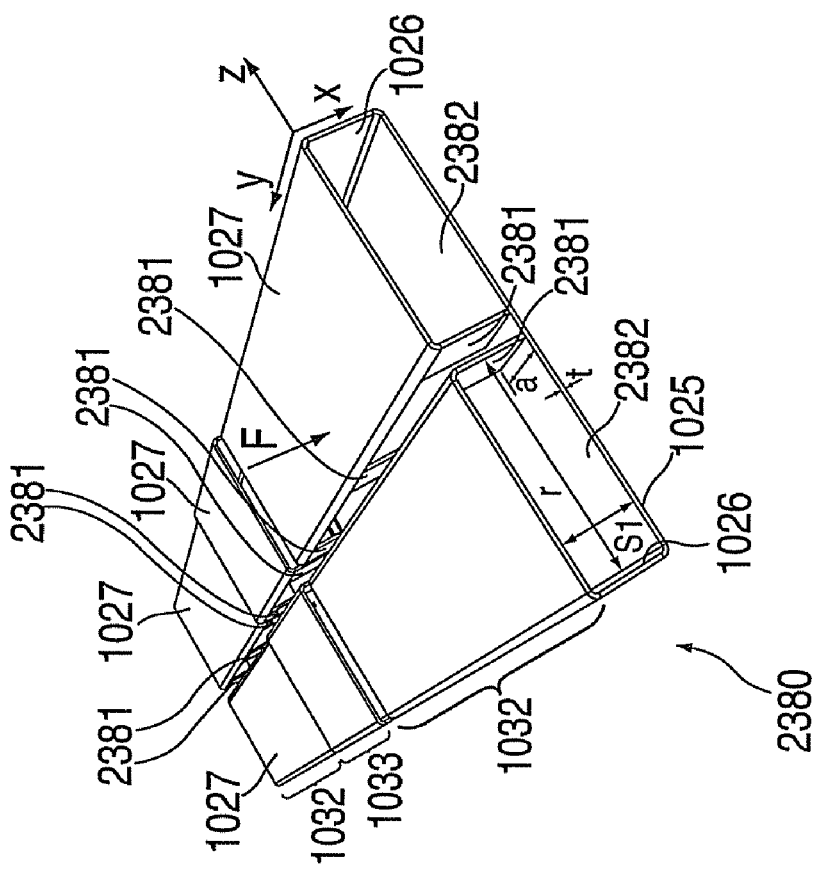
FIG. 23 depicts a folded heatsink that may be implemented by exemplary embodiments.

FIG. 23 shows yet another variation of the front folded heatsink 923 that may be implemented by exemplary embodiments of the present invention: a crush-resistant folded heatsink 2380, each of whose arms 1027 is prevented from accidental deflection toward the base 1025 by the addition of a plurality of fingers 2381. Each finger 2381, which projects substantially at right angles to one of the arms 1027 and extends toward the base 1025, is just long enough to nearly meet the base 1025. Consequently, a force such as F applied in the +x direction will not cause substantial deflection of the arms 1027.

The plurality of fingers 2381 effectively separates the airflow opening EFGJ (FIG. 11B) of the crush resistant folded heatsink 2380 into two airflow channels 2382, each having dimensions $s_1 \times r$ in the DRAM segment 1032 of the crush resistant folded heatsink 2380, and each having dimensions $s_2 \times r$ in the hub-chip segment 1033 of the crush resistant folded heatsink. However, from an aerodynamic viewpoint, these two airflow channels 2382 are not separate; they communicate with each other through the spaces between the plurality of fingers 2381 that extend from each arm 1027, and thus aerodynamically look much like a single, undivided channel. In this way, the plurality of narrow fingers 2381 is preferred to a single, wide finger, because the narrow fingers 2381 with intervening spaces preserve the low pressure drop of the folded heatsink, whereas a single, wide finger would increase the pressure drop, inasmuch as the opening EFGJ in FIG. 11B would then be truly divided in half, leading to a smaller hydraulic diameter.

In FIG. 23, the maximum value $F_{max}$ of the force F that may be applied to each of the fingers 2381 without causing it to buckle is given by the well-known Euler buckling formula for a fixed-free column, $$F_{max} = \frac{\pi^2 EI}{4s^2}, \tag{62}$$

where E is Young's modulus of the finger material, and I is the area moment of inertia of the a-by-t rectangular cross section, which is $I = a\, t^3/12$. Thus, $$F_{max} = \frac{\pi^2}{48} Eat \left(\frac{t}{s}\right)^2. \tag{63}$$

Typical values appropriate for a DIMM-cooling application are E=70 GPa (aluminum), a=5 mm, s=2.5 mm, t=0.3 mm, and therefore $F_{max}$=311 N=70 lb. This is a considerable force, indicating that, in a typical situation, such as handling or shipping, the structure is highly unlikely to fail by buckling of the fingers 2381.

The maximum force $F_Y$ that may be applied to each of the fingers 2381 without causing it to yield in compression is given by:

$$F_Y = \sigma_Y A, \tag{64}$$

where $\sigma_Y$ is the yield stress of the material, and A is the cross-sectional area of the finger.

For the bendable aluminum alloy known as 5052, $\sigma_Y$=90 MPa. For the typical dimensions given above, A=a t=1.5E−6 m², hence $F_Y$=135 N=30 lb. $F_Y$ is smaller than $F_{max}$, meaning that the fingers 2381 would yield before they buckled. Nevertheless, $F_Y$ is still large, such that the fingers 2381, in typical situations such as shipping and handling, are unlikely to fail by either mechanism.

Figure 24:
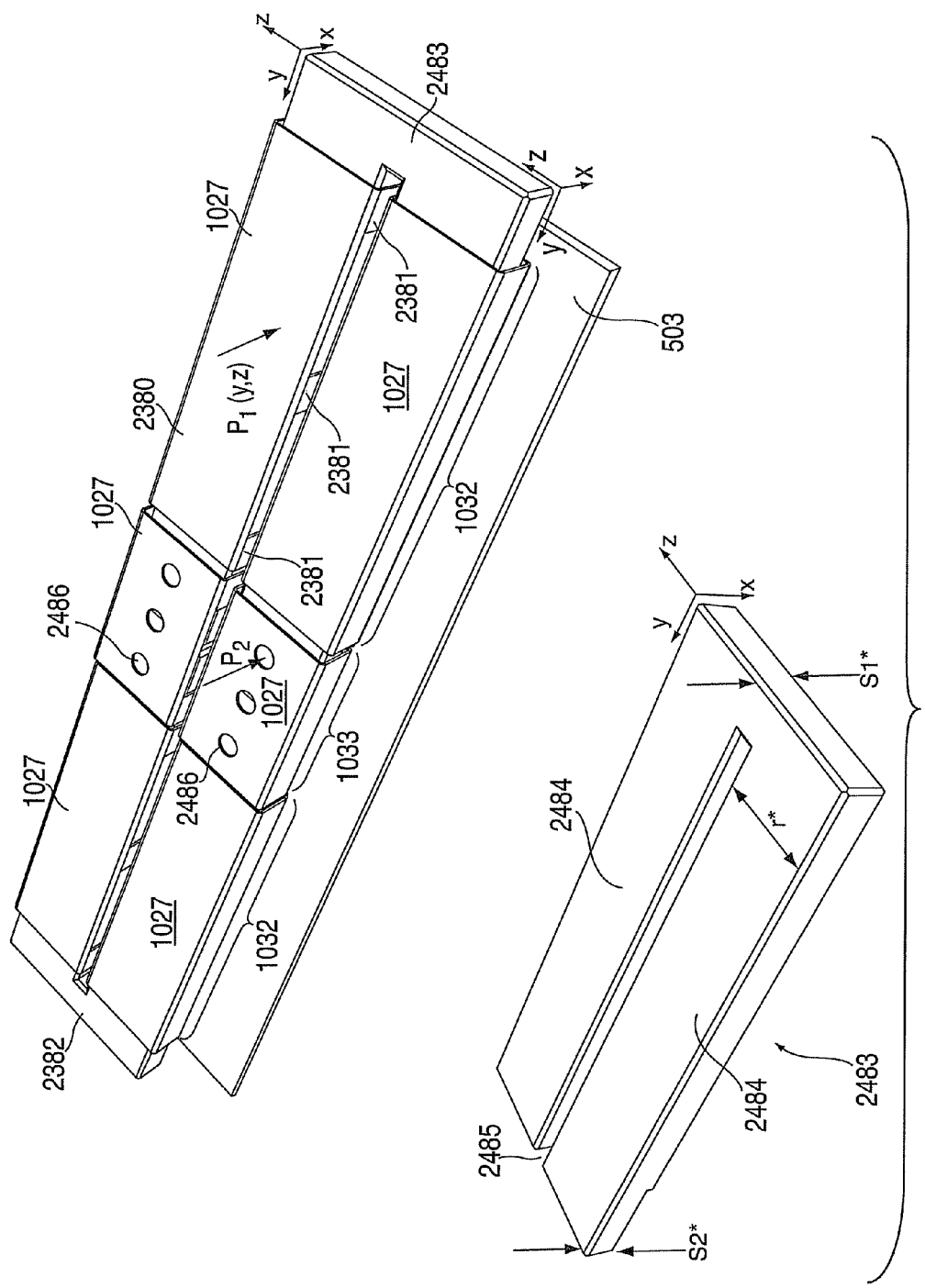
FIG. 24 depicts a folded heatsink installment tool that may be implemented by exemplary embodiments.

Adding the fingers 2381 to the front folded heatsink 923 to produce the crush-resistant heatsink 2380 (and similarly, adding such fingers 2381 to the rear folded heatsink 924) precludes the use of the squeegee-shaped tool 1028 described previously in connection with FIG. 10A. FIG. 24 depicts a U-Shaped tool 2483 comprising two prongs 2484 separated by a slit 2485 that may be inserted into the +y end of the front folded heatsink 923, and another, identical U-shaped tool 2483 may be inserted into the −y end of the front-folded heatsink 923. For each of the two U-shaped tools 2483, the two prongs 2484 straddle the double row of fingers 2381, and fit snugly in the two airflow channels 2382. That is, the x dimension $s_1^*$ of each prong 2484 is just slightly less than the inside dimension $s_1$ (FIG. 23) that separates base 1025 from arm 1027 in the DRAM segments 1032 of the front folded heatsink 923. At its open end, the prong has a rabbeted bottom surface, producing a reduced x dimension $s_2^*$ that accommodates the step in the hub-chip segment 1033 of the front folded heatsink 923, as described previously in connection with FIG. 10B.

Finally, the z dimension r* of each prong 2484 is just slightly less than the inside dimension r (see for e.g., FIG. 23) that separates shoulder 1026 from fingers 2381. Thus, the prongs 2384 of the U-shaped tool 2483 slide easily in the airflow channels 2382 of the crush resistant heatsink 2380. However, because the clearance $s_1$-$s_1^*$ in the x direction between the arm 1027 and the U-shaped tool 2483 is small, a pressure distribution $p_1(y, z)$ (FIG. 24) of modest intensity closes the clearance by creating a slight deflection of the arm 1027, thereby allowing the pressure distribution $p_1(y, z)$ to be transmitted through the thickness of the U-shaped tool 2483, through the heatsink base 1025, and finally through a layer of adhesive that bonds the crush-resistant heatsink 2380 to the DRAMs. Because the pressure is thus conveyed to the adhesive layer, and because y z variations in the applied pressure distribution $p_1(y, z)$ are evened out in the adhesive layer by virtue of the thickness of the U-shaped tool 2483, a thin, uniform adhesive layer having low thermal resistance is obtained.

If the arms 1027 in the hub-chip segment 1033 are not coplanar with those in the DRAM segments 1032, but instead, to accommodate thick hub chips, are displaced toward the −x direction (upward in FIG. 24), then the x clearance between the U-shaped tool 2483 and the heatsink arms 1027 in the hub-chip segment 1033 will not be small. It will therefore be impossible, in the hub-chip segment 1033, to transmit pressure $p_2$ through the heatsink arm 1027 to the U-shaped tool 2483, and thence to the adhesive layer below the heatsink base 1025, because the large x clearance between arm 1027 and tool 2483 cannot be closed by slight deflection of the arm 1027. Consequently, it may be necessary to perforate each of the two arms 1027 in the hub-chip segment 1033 with a plurality of holes 2586, such that the pressure $p_2$ necessary to obtain a good bond in the adhesive layer may be applied through the holes directly to the top surface of the U-shaped tool 2483.

Figure 25:
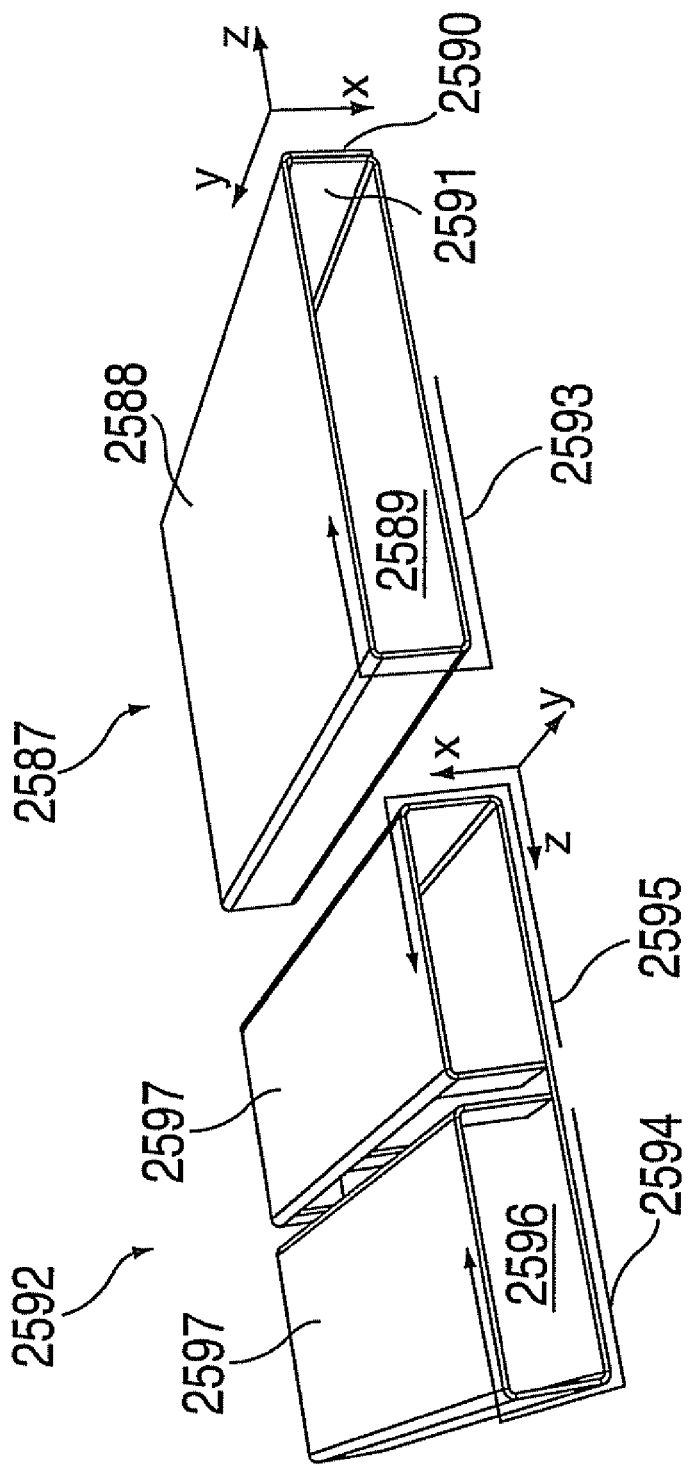
FIG. 25 depicts a folded heatsink that may be implemented by exemplary embodiments.

FIG. 25 shows yet another version of the front folded heatsink 923 that may be implemented by exemplary embodiments of the present invention: a box beam heatsink 2587, where the arm 2588 is substantially the same length as the base 2589, such that the finger 2590 substantially overlaps the shoulder 2591, in close proximity thereto. FIG. 25 also shows, for contrast, a shortened crush resistant heatsink 2592, which is similar to crush resistant folded heatsink 2380 except that it covers only one group of front DRAMs 506. The box beam heatsink 2587 is advantageous because its simple shape may be inexpensively formed from folded sheet metal (such a shape, with thin walls, cannot readily be extruded). However, the box beam heatsink 2587 has the disadvantage, vis-á-vis the shortened crush resistant heatsink 2592 of providing only one high-thermal-conductivity heat-conduction path 2593 from the base 2589 to the arm 2588, because the shoulder 2591 is not connected to the arm 2588. In contrast, the crush resistant heatsink 2592 has two high-thermal-conductivity paths 2594 and 2595 from base 2596 to arms 2597. Thus, the box-beam heatsink 2587 is thermally inferior to the crush-resistant heatsink 2592. This thermal inferiority of the box-beam heatsink 2587 may be eliminated by soldering or brazing the finger 2580 to the shoulder 2591, but doing so adds significant fabrication cost in high-volume manufacturing. Consequently, despite the simple shape of the box beam heatsink 2587, the crush resistant heatsink 2592 may be preferred.

Figure 26A:
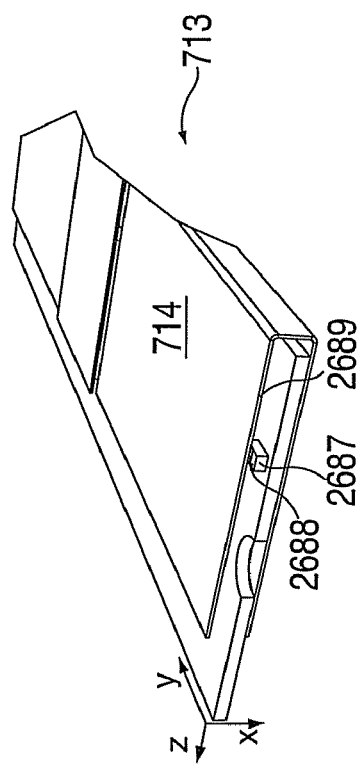
FIGS. 26A and 26B depict flat and exemplary folded heatsinks in relation to a surface mount capacitor having exposed electrically live metal pads.
Figure 26B:
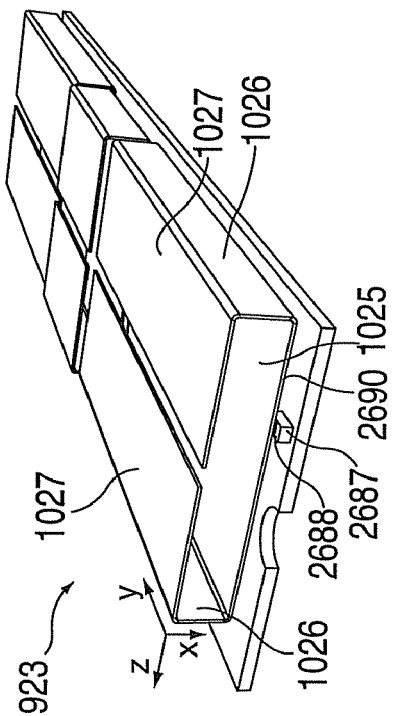

One of the advantages of exemplary embodiments of the folded heatsinks disclosed herein, in comparison to the conventional heatsinks is that the folded heatsinks are far less susceptible to electrical shorting of the heatsink's metal to exposed metal of circuit components on the underlying circuit card 503. This advantage applies to all the exemplary embodiments of folded heatsinks disclosed herein, including the variations referred to above as 923 (FIG. 9A), 924 (FIG. 9B), 1852 (FIG. 18), 1958 (FIG. 19A), 1960 (FIG. 19B), 2165 (FIG. 21), 2175 (FIG. 21), 2278 (FIG. 22), and 2380 (FIG. 23). For example, FIG. 26A shows a view of flat heatsink 713 and the underlying circuit card 503 whose components it cools; FIG. 26B shows the same view with exemplary embodiments of the folded heatsink such as the front folded heatsink 923. In practice, electrical components on the surface of the circuit card 503, such as the surface-mount capacitor 2687, often have electrically live metal pads 2688 very close to an under-surface of the heatsink; namely, in the case of FIG. 26A, undersurface 2689 of the flat heatsink 713, or in the case of FIG. 26B, undersurface 2690 of the front folded heatsink 923. Convecting surface 714 of the conventional flat heatsink 713 is unprotected from forces that cause its undersurface 2689 to deflect into electrical contact with metal pad 2688, thereby causing undesirable electrical shorting and possible circuit failure. In contrast, the convecting surface 1025 of the front folded heatsink 923 is protected, by the overarching arms 1027, from forces that would deflect it. Forces on the arms 1027 are carried to the shoulders 1026, which provide stiffness. Thus, exemplary embodiments of the folded heatsink are much less susceptible to electrical shorting to nearby electrical components such as capacitor 2687, an important practical advantage of embodiments of the present invention.

Another advantage of the novel folded heatsinks disclosed herein, in comparison to many conventional finned heatsinks, is the ability to accommodate an adhesive identification label on any one of the arms, such as arm 1027 of front folded heatsink 923 (FIG. 9A), rear folded heatsink 924 (FIG. 9B) or crush resistant folded heatsink 2380 (FIG. 23). In the DIMM industry, for example, the industry-standard label, which specifies the characteristics of the DIMM and its constituent DRAM, is a series of up to 31 characters, such as "1 GB 1R×4 PC2-3200F-333-10-C0", printed in type as small as 8 points, in which case the dimensions of the label would be roughly 5×45 mm. This size label will not fit on any exposed surface of the conventional finned heatsinks when the DIMMs are tightly packed in the x direction, because the x dimension of the finned heatsink is too small for the label to be placed on any of the fins. However, the 5×45 mm label will fit easily on any one of the outer arms 1027 of novel folded heatsinks, thereby satisfying the industry labeling requirement. Note that such a label does not significantly alter the thermal performance of the heatsink, because it occupies only about two percent of the heatsink's convecting area. Also note that the dimensions and contents of the label given above are examples and may be altered.

Yet another advantage of the novel folded heatsinks disclosed herein, in comparison to the conventional flat heatsinks 713, is the ease with which they may be removed for purposes of rework and diagnostic probing. Removal may be accomplished using the U-shaped tool 2483 (FIG. 24) as a lever, applying torque about the z axis to pry the heatsink from the underlying DIMMs and hub chips. Alternatively, the U-shaped tool 2483 may be used as a wrench, applying torque about the x axis to twist the heatsink with respect to the underlying chips, thereby causing failure of the adhesive bond. In either case, to increase torque, it may be desirable to make the U-shaped tool 2483 longer in the y direction than that shown in FIG. 24. The preferred removal technique depends on the adhesive layer that bonds the heatsink to the chips. With the U-shaped tool 2483, removal is relatively easy if the adhesive layer is a typical thermal tape, such as Chomerics T412. Note that the convention flat heatsink 713 is not amenable to such removal techniques, because its flat structure does not accommodate the necessary tool.

Numerical Simulations Comparing Cooling Arrangements 922 and 816

To prove further the superiority of the folded-heatsink cooling arrangement 922 over the conventional finned-heatsink cooling arrangement 816 when W is small, computational fluid-dynamic simulation (CFD), well known in the art, may be used. These simulations solve the well-known equations (continuity, Navier-Stokes, and energy) governing the transport of mass, momentum, and energy in fluids, as well as the equations governing the conduction of heat in solids. The results predict the velocity, pressure, and temperature fields in the fluid, as well as the temperature distribution in solids such as the heat sources (e.g. hub chips and DRAM). CFD simulations reported herein were conducted using the computer program "Icepak" available under license from Fluent Corporation. CFD simulation is used herein for two purposes:

(1) To verify the mathematical solution exemplified by FIGS. 12-17 for the simple geometry of FIG. 11, thereby proving, for this simple geometry, the superiority of folded heatsinks 1144, 1145 over finned heatsinks 1136, 1141 for small W.

(2) To investigate more complicated, realistic geometries, such as DIMM circuit cards 503 having hub chips 507 and a plurality of DRAMs, where hub chips 507 and DRAMs have different thicknesses, leading to the front folded heatsink 923 shown in FIG. 10B. Numerical results in such cases prove, for this more realistic geometry as for the simple geometry, the superiority of folded heatsinks over finned heatsink in applications where W is small.

Comparison of CFD Simulation to Mathematical Solution for Simple Geometry.

Figure 27:
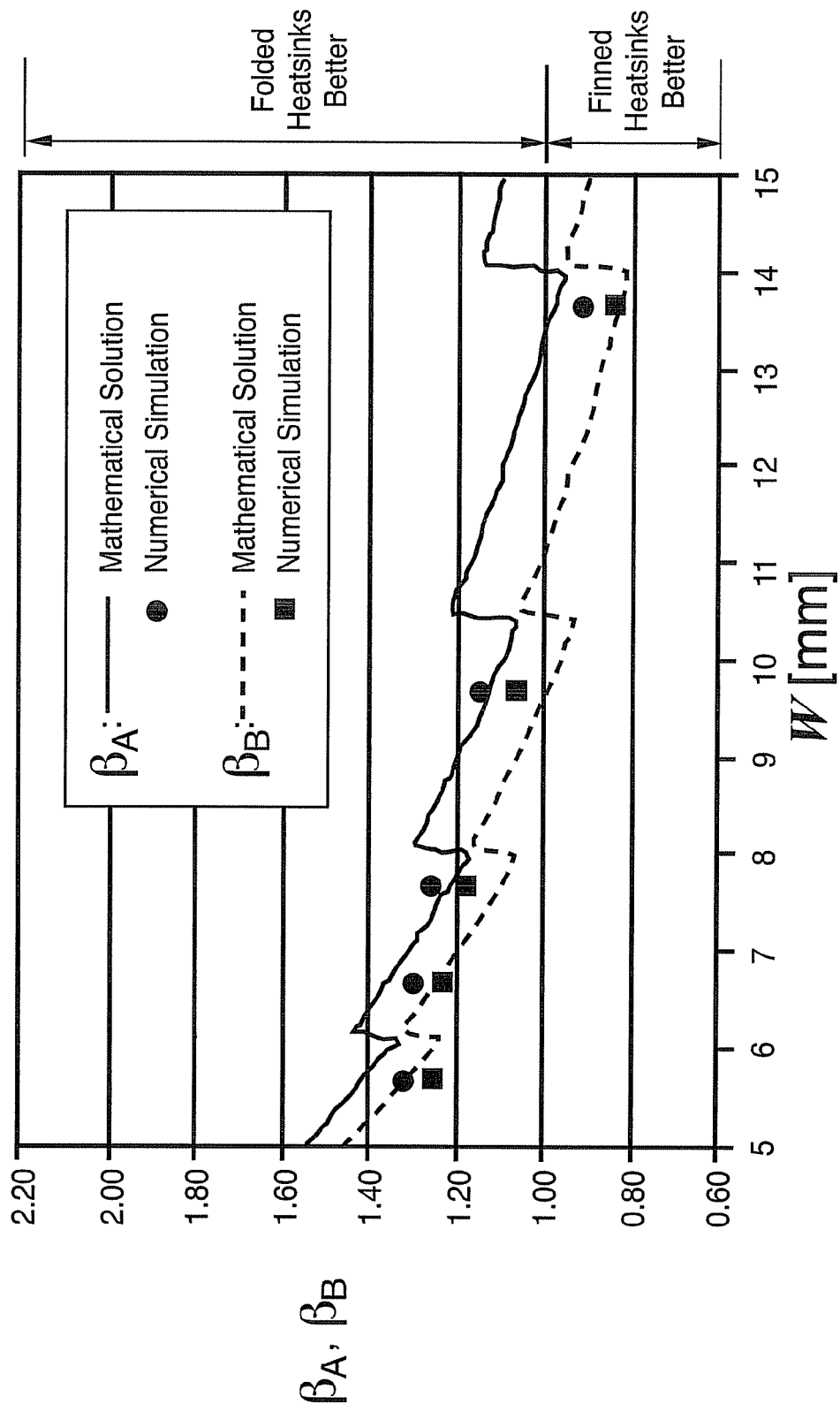
FIGS. 27 and 28 are charts that compare the effectiveness of an exemplary folded heatsink and a finned heatsink.

For finned-heatsink base thickness b=1.00 mm and fin thickness f=0.50 mm, FIG. 27 compares, as a function of width W, the mathematical solutions for $\beta_A$ and $\beta_B$ (previously shown as the lowest curve on FIG. 13 and FIG. 16 respectively) to numerical, CFD simulations that use identical values of all parameters, as listed in the foregoing section "*Example Results of Mathematical Analysis*". The mathematical results agree with the numerical-simulation results, lending credence to both techniques, and proving that substantial advantage is obtained with exemplary embodiments of the folded heatsinks of the present invention when compared with the conventional finned heatsinks for important applications such as closely spaced DIMMs.

Figure 28:
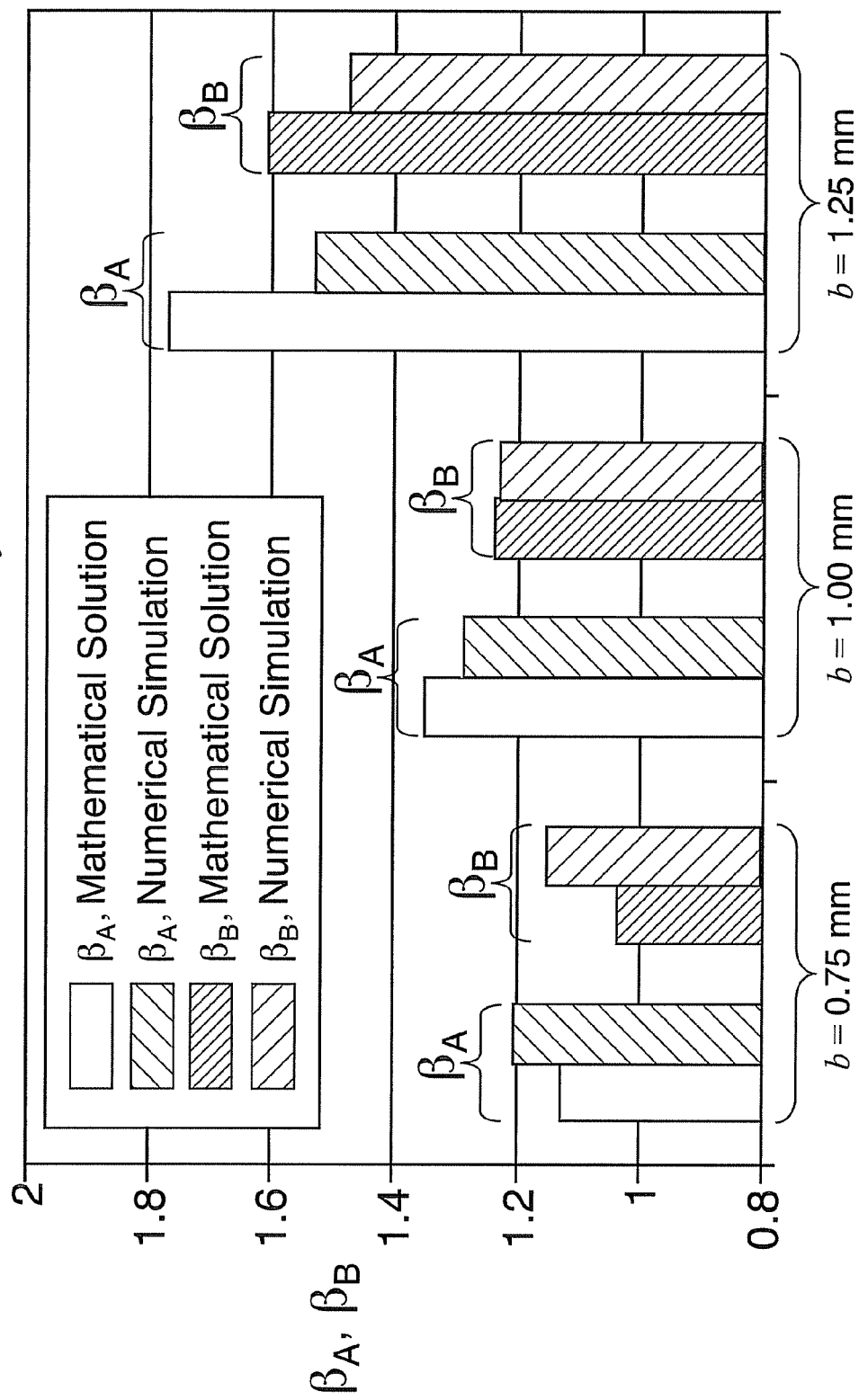

For width W=6.7 mm and finned-heatsink fin thickness f=0.50 mm, FIG. 28 compares, for three values of finned-heatsink base thickness b, the mathematical and numerically simulated solutions for $\beta_A$ and $\beta_B$. All other parameters are the same as for FIG. 27. Here, the mathematical solutions shows stronger dependence on b than do the numerical solutions, but the basic conclusion that $\beta>1$ when W is small, and therefore that the folded heatsinks are superior in such applications, is clearly confirmed by both methods.

CFD Simulation for More Realistic Geometry

To simulate geometries that are more complicated and realistic, such as DIMM cards having hub chips and a plurality of DRAM, the following assumptions were adopted: approaching air velocity $U_0$=3 m/s; inlet air temperature=25° C.; DIMM card size: x×y×z=1.27×133.35×38 mm; DRAM card pitch $\Psi$=11 mm; DRAM size: x×y×z=1.2×11.0×11.5 mm; hub-chipsize: x×y×z=19.5×23.5×2.25 mm; 40 DRAMs per DIMM card, 0.35 W each; and one 6 W hub chip per DIMM card, thus, total power for each DIMM card is 20 W. Under these assumptions the following four cases were simulated:

Case 1: Configuration shown in FIG. 6, comprising a conventional hub chip finned heatsink 817 on the hub chip 507 and no heatsinks on the DRAMs 506, 509. Finned heatsink parameter (using the notation on FIG. 11A) are: b=1.25 mm, f=0.62 mm, $\lambda$=2.625 mm, and total heatsink size (x×y×z)=19.5×29.5×5.35 mm.

Case 2: Flat-heatsink cooling arrangement 712 shown in FIG. 7, comprising the prior-art monolithic flat heatsink 713 on the hub chip 507 and the DRAMs 506, 509. Sheet-metal thickness is 0.8 mm.

Case 3: Folded-heatsink cooling arrangement 922 shown in FIG. 9, comprising the novel, front folded heatsink 923 on front DRAMs 506 and hub chip 507, and the rear folded heatsink 924 on rear DRAMs 509. Sheet-metal thickness is 0.3 mm.

Case 4: Configuration shown in FIG. 20, comprising the novel folded heatsinks 1958, 1960 on front DRAMs 506 and rear DRAMs 509 respectively, and the conventional finned heatsink 2062 on the hub chip 507. Sheet-metal thickness is 0.3 mm.

Results of these four cases are summarized in a table shown as FIG. 29; details of each case are given graphically in FIGS. 30-33.

FIG. 29 demonstrates that for this realistic model of a DIMM circuit card 503, as for the simple model investigated mathematically, the folded heatsink disclosed herein produce DRAM and hub-chip temperatures that are significantly lower than the conventional heatsinks. Let $\Delta T$ be temperature rise above the 25° C. air inlet temperature. The rightmost three columns of the table give the largest value of $\Delta T$ experienced, respectively, by DRAM chips 506 on the front surface 505 of the DIMM card 503, the DRAM chips 509 on the rear surface 508 of the DIMM card 503, and the hub chip 507 on the front surface of the DIMM card 503. Rows of the table correspond to four different heatsink arrangements designated as Cases 1 through 4 above. The second column of the table specifies the figure numbers that show the geometries of the four heatsink arrangements; the fourth and fifth columns specify the type of heatsinks used in each case.

As stated in the third column of FIG. 29, FIGS. 30-33 show some details of the numerical simulations of Cases 1-4, respectively. In each of these figures, the upper graphic is a schematic view, looking toward the +x direction, of the front DRAM chips 506 and hub chip 507 that lie on front surface 505 of DIMM card 503, whereas the lower graphic is a schematic view, also looking toward the +x direction, of the rear DRAM chips 509 that lie on the rear surface 508 of the DIMM card. In the upper graphic of each figure, outlines of the front DRAM chips 506 and hub chip 507 are shown as solid lines to indicate that they are visible in the view shown. In contrast, in the lower graphic of each figure, outlines of the rear DRAM chips 509 are shown as dashed lines to indicate that, in the view shown, they are hidden behind the DIMM card 503. Inlet cooling air 3091 enters from the left in both graphics. When the DRAMs and hub chip are heated with the powers specified above, a steady-state temperature distribution develops therein that depends on the heatsink configuration used. For any of the heatsink configurations represented by Cases 1-4, let $TF_j$ be the maximum steady-state temperature found by CFD simulation within the $j^{th}$ front DRAM (j=1, ..., 18); let $TR_k$ be the maximum steady-state temperature found within the $k^{th}$ rear DRAM (k=1, ..., 22); and let TH be the maximum steady-state temperature found within the hub chip. For Cases 1-4, the 18 maximum front-DRAM temperatures $TF_j$ and the maximum hub-chip temperature TH are given in the upper graphic of FIGS. 30-33 respectively, whereas the 22 maximum rear-DRAM temperatures $TR_k$ are given in the lower graphic of FIGS. 30-33, respectively. Each of these maximum temperatures is written within the outline of the heat-producing device wherein it occurs, and a black dot is given at the location where it occurs.

The relationships between the temperatures $TF_j$, TH, $TR_k$ shown on FIGS. 30-33 and the temperature differences $\Delta T_F$, $\Delta T_R$, $\Delta T_H$ shown in the rightmost three columns of FIG. 29 are as follows:

$$\Delta T_F \equiv \max_j (TF_j - T_0), \quad (65)$$

$$\Delta T_R \equiv \max_k (TR_k - T_0), \quad (66)$$

$$\Delta T_H = TH - T_0. \quad (67)$$

Figure 30:
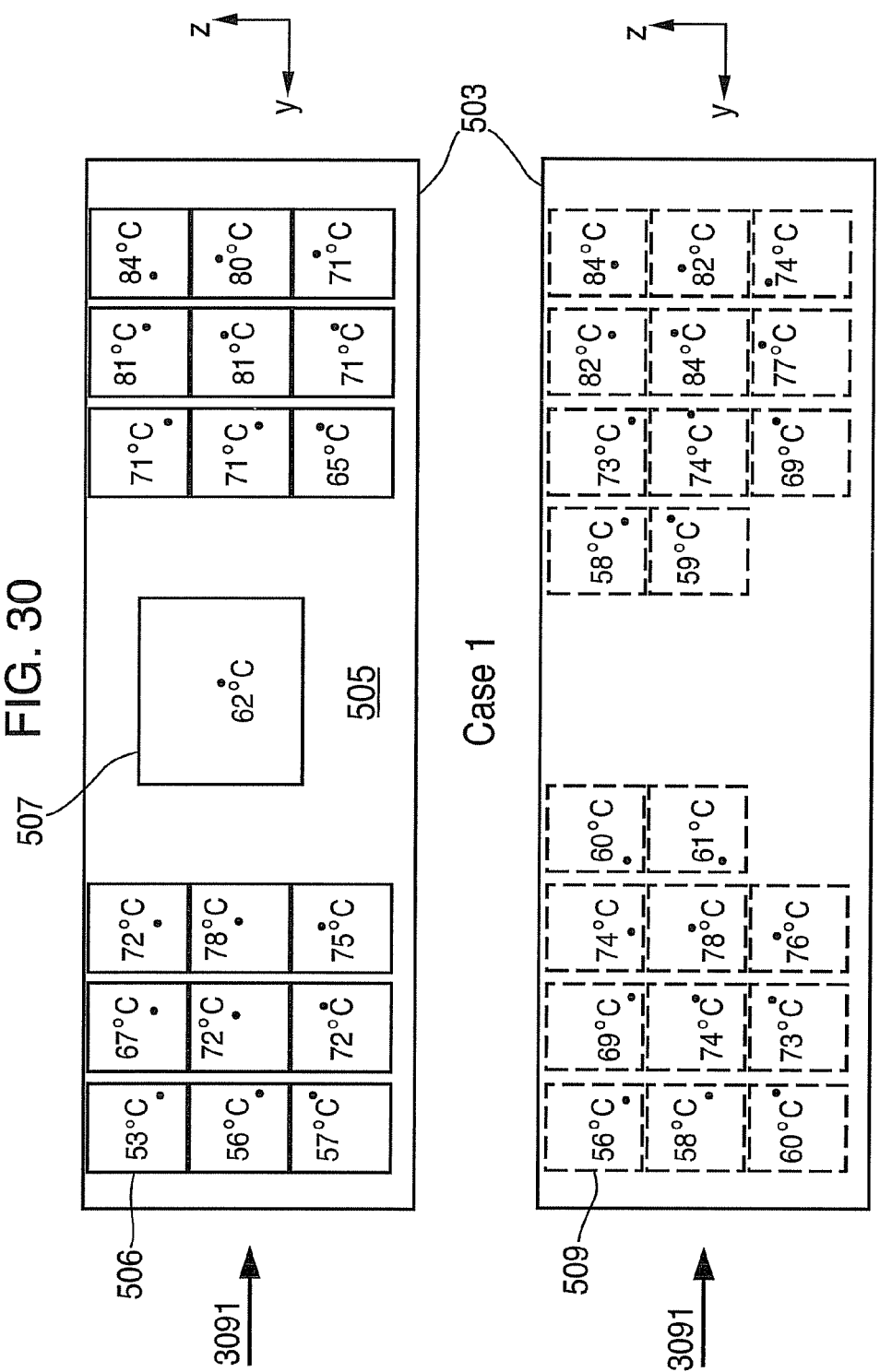

FIG. 30 shows that the hub chip finned heatsink 817 is effective at cooling the hub chip 507; its temperature is well below that of the DRAMs, despite its far-higher power. The hottest DRAM is at 84° C., just under the maximum suggested temperature of 85° C. DRAM temperatures differ considerably, despite the fact that each dissipates the same power.

These differences are primarily due to the local temperature of ambient air. For example, upstream DRAMs (left side of FIG. 30) are cooler than downstream DRAMs (right side of FIG. 30) because the air surrounding the latter is warmer, having been heated by components upstream. This is particularly true of the upper two rows of downstream DRAMs, which is cooled by air warmed by the considerable power of the hub chip 507.

Figure 31:
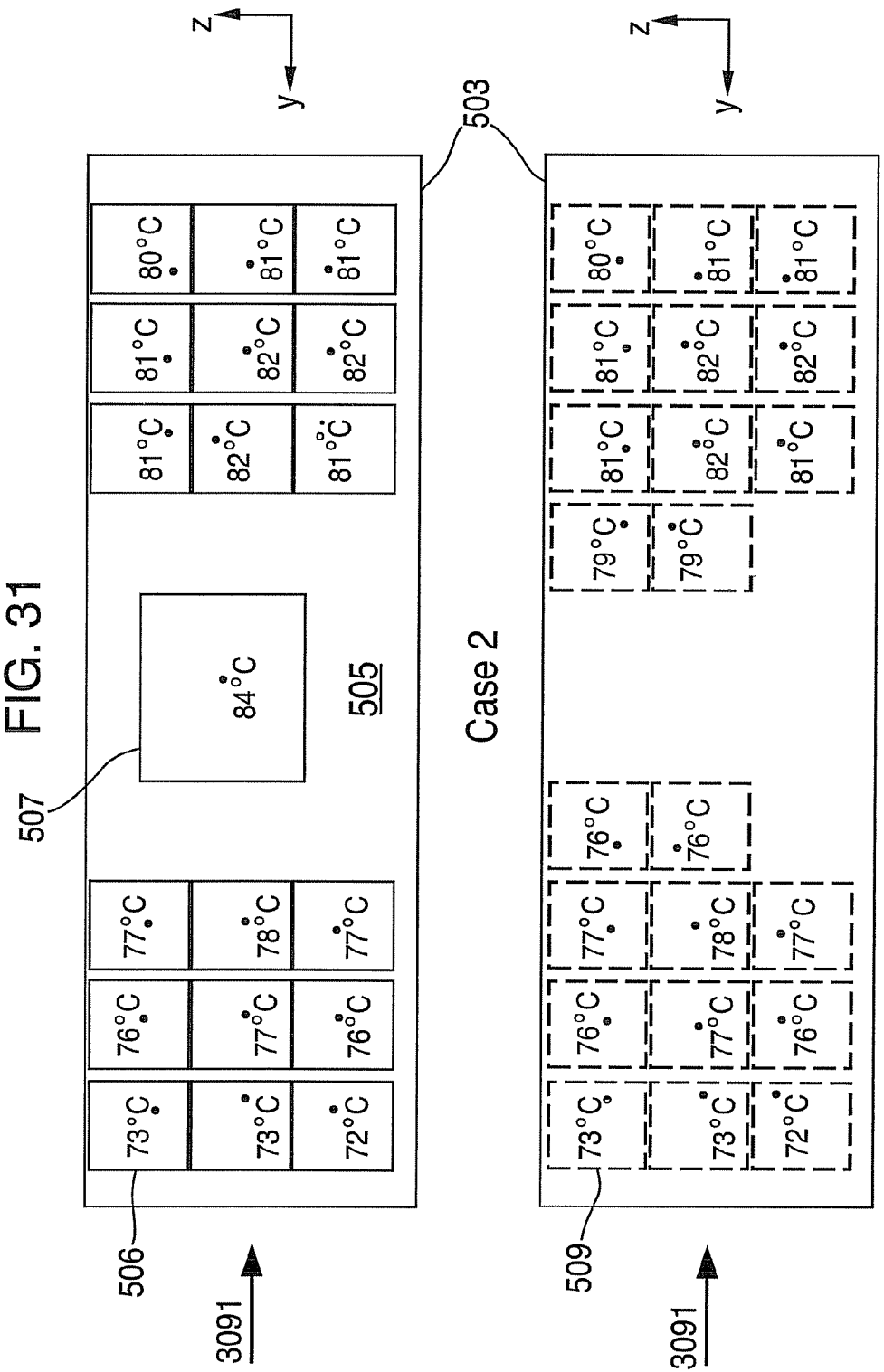

Comparison of FIG. 31 to FIG. 30 shows that FIG. 31's monolithic flat heatsink 713, whose geometry is shown in FIG. 7, is actually a poor cooling solution vis-á-vis the FIG. 30 arrangement, whose geometry is shown in FIG. 6. Conventional wisdom says that the flat copper heatsink should spread the heat to reduce peak temperatures, but this effect is actually minimal—the 84° C. peak DRAM temperature is only reduced to 82° C. Instead, the considerable heat load of the hub chip, conducted through the copper heatsink toward the DRAM, actually makes most DRAMs warmer than if, as in Case 1, they have no heatsink. Meanwhile, the hub chip 507 is also considerably hotter in Case 2 (84° C.) than in Case 1 (62° C.), because the monolithic flat copper heatsink is not as effective as the finned heatsink 611.

Comparison of FIG. 33 to FIG. 30 shows in detail that, for real DIMM cards packaged close together, exemplary embodiments of the folded heatsinks (e.g., 923, 924), such as that shown in FIG. 19, produce dramatically lower DRAM temperatures than prior-art solutions, and also produce a hub-chip temperature (63° C.) that is nearly the same as for the prior-art finned heatsinks (62° C.). The maximum DRAM temperature is reduced 26° C., from 84° C. to 58° C., while the average temperature is reduced 17.1° C., from 70.8° C. to 53.7° C. These cooling advantages become even more pronounced as the DIMM-card pitch $\Psi$ (11 mm in this example) is further reduced. Such significant gains in cooling performance imply that the novel folded heatsinks may be of critical importance with even smaller values of DIMM-card spacing $\Psi$, values that would be impossible with prior-art cooling schemes.

Comparison of FIG. 33 (Case 4) to FIG. 30 (Case 1) demonstrates that the alternative novel heatsink arrangement shown in FIG. 20, where the DRAMs are cooled by folded heatsink while the hub chip is cooled by a conventional finned heatsink, is also advantageous vis-á-vis prior-art solutions. The maximum DRAM temperature is 60° C., compared to 84° C. for no heatsinks and 82° C. for the monolithic flat heatsink.

Analytical Conclusion

In summary, numerical simulation and mathematical analysis have both shown that the novel folded heatsinks disclosed herein have significant advantages over prior-art cooling solutions when the distance W available for heatsinks between opposing DIMMs (shown in FIGS. 11A and 11B) is below a threshold value W*. For conditions assumed in FIG. 27, for example, the threshold value is W*≈11 mm, which translates to a threshold value $\Psi$*=14.3 mm of DIMM-card pitch $\Psi$, assuming typical thickness of the DIMM card 503 (1.27 mm) and the DRAM chips 506, 509 (1.0 mm). That is, for conditions assumed in FIG. 27, the novel folded heatsink are advantageous when DIMM-card pitch $\Psi$ is less than 14.3 mm, the advantage becoming larger and larger as $\Psi$ decreases. Conventional finned heatsinks are still preferable if $\Psi$ is large. For example, if finned heatsinks are manufacturable with base thickness b=1.0 mm, as assumed in FIG. 27, then they are preferable to folded heatsinks when $\Psi$ is greater than 14.3 mm. However, if the minimum manufacturable value of finned-heatsink base thickness b is larger than 1.0 mm, then the novel folded heatsinks disclosed herein are advantageous over an even wider range of $\Psi$, including values larger than 14.3 mm. Because state-of-the-art computers typically strive for DIMM-card pitch $\Psi$ that is considerably smaller than 14.3 mm, the folded heatsinks disclosed herein have great practical importance in the industry, and may well have importance in other industries where heat-producing components are packaged in close proximity.

Background Information on Memory Devices

Because cooling of memory devices constitutes an important industrial application of the current invention, it is appropriate to discuss some particulars thereof. Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast-Page-Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including solder interconnects, conductive adhesives, socket structures, pressure contacts and other methods which enable communication between the two or more devices via electrical, optical or alternate means.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. An assembly comprising:
   one or more heat-producing devices each having an exposed substantially planar surface;
   a folded heatsink formed from a continuous sheet of metal for cooling the heat-producing devices, the folded heatsink comprising:
      a base having a first end and a second end and lying substantially parallel to the exposed substantially planar surface of one or more of the heat-producing devices and affixed in thermal contact thereto;
      two shoulders each having a proximal end and a distal end, said proximal ends of said shoulders projecting substantially at right angles from said first and second ends of said base; and
      two arms each having a proximal end and a distal end, said proximal ends of said arms projecting substantially at right angles from said distal ends of said shoulders such that the base, shoulders and arms form a nearly closed rectangular tube; and
   a finned heatsink in contact with the planar surface of one or more of the heat-producing devices that are not in contact with the folded heatsink.

2. An assembly comprising:
   one or more heat-producing devices each having an exposed substantially planar surface;
   a folded heatsink formed from a continuous sheet of metal for cooling the heat-producing devices, the folded heatsink comprising:
      a base having a first end and a second end and lying substantially parallel to the exposed substantially planar surface of one or more of the heat-producing devices and affixed in thermal contact thereto;
      two shoulders each having a proximal end and a distal end, said proximal ends of said shoulders projecting substantially at right angles from said first and second ends of said base; and
      two arms each having a proximal end and a distal end, said proximal ends of said arms projecting substantially at right angles from said distal ends of said shoulders such that the base, shoulders and arms form a nearly closed rectangular tube; and
   a flat heatsink in contact with the planar surface of one or more of the heat-producing devices that are not in contact with the folded heatsink.

3. A memory module comprising:
   one or more heat-producing devices each having an exposed substantially planar surface, the heat-producing devices including a hub device and one or more memory devices;
   a folded heatsink formed from a continuous sheet of metal for cooling the heat-producing devices, the folded heatsink comprising:
      a base having a first end and a second end and lying substantially parallel to the exposed substantially planar surface of one or more of the heat-producing devices and affixed in thermal contact thereto;
      two shoulders each having a proximal end and a distal end, said proximal ends of said shoulders projecting substantially at right angles from said first and second ends of said base; and
      two arms each having a proximal end and a distal end, said proximal ends of said arms projecting substantially at right angles from said distal ends of said shoulders such that the base, shoulders and arms form a nearly closed rectangular tube; and
   a finned heatsink in contact with the planar surface of one or more of the heat-producing devices that are not in contact with the folded heatsink.

4. The memory module of claim 3 wherein the finned heatsink is in contact with one or more of the hub devices.

* * * * *